(12) United States Patent
Morishima

(10) Patent No.: US 7,586,370 B2
(45) Date of Patent: Sep. 8, 2009

(54) CLASS D AMPLIFIER

(75) Inventor: Morito Morishima, Fukuroi (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 12/316,268

(22) Filed: Dec. 11, 2008

(65) Prior Publication Data

US 2009/0102557 A1 Apr. 23, 2009

Related U.S. Application Data

(62) Division of application No. 11/376,580, filed on Mar. 15, 2006.

(30) Foreign Application Priority Data

| Mar. 18, 2005 | (JP) | ............................. 2005-079062 |
| Oct. 13, 2005 | (JP) | ............................. 2005-298562 |
| Mar. 1, 2006 | (JP) | ............................. 2006-054716 |

(51) Int. Cl.
*H03F 3/217* (2006.01)
(52) U.S. Cl. ...................... 330/251; 330/10; 330/207 A
(58) Field of Classification Search .................. 330/10, 330/207 A, 251; 375/238
See application file for complete search history.

(56) References Cited

U.S. PATENT DOCUMENTS

| 5,777,512 A | 7/1998 | Tripathi et al. |
| 6,229,390 B1 | 5/2001 | Delano et al. |
| 6,373,334 B1 | 4/2002 | Melanson |
| 6,466,087 B2 | 10/2002 | Ruha |
| 6,518,838 B1 | 2/2003 | Risbo |
| 6,768,779 B1 | 7/2004 | Nielsen |
| 7,102,426 B2 | 9/2006 | Kitamura |
| 7,276,963 B2* | 10/2007 | Wegner ....................... 330/10 |
| 7,317,349 B2* | 1/2008 | Morishima ................... 330/10 |
| 2002/0180518 A1 | 12/2002 | Midya et al. |
| 2005/0024133 A1 | 2/2005 | Midya et al. |
| 2005/0052229 A1 | 3/2005 | Nagasue |

FOREIGN PATENT DOCUMENTS

| JP | 59-183510 | 10/1984 |
| JP | 2003-249825 | 9/2003 |

* cited by examiner

*Primary Examiner*—Khanh V Nguyen
(74) *Attorney, Agent, or Firm*—Pillsbury Winthrop Shaw Pittman LLP

(57) ABSTRACT

The invention is directed to a class D amplifier. According to the class D amplifier, sound data applied to an input terminal is supplied through a compensation circuit to a PWM circuit, from which a PWM signal is output. The PWM signal is converted to an analog signal through a first low pass filter, which is delivered to a speaker. On the other hand, the sound data is delayed by a delay circuit, and is converted to an analog signal by a digital to analog converter. The higher frequency components of the data are removed by a second low pass filter, and the rest of the data is furnished to a differential amplifier. The differential amplifier amplifies a difference between an output of the first low pass filter and an output of the second low pass filter, which is then supplied to an analog to digital converter. The analog to digital converter converts an output from the differential amplifier to digital data, which is then supplied to the compensation circuit. By doing so, a compensation value based on an output from the analog to digital converter is added to the following PCM sound data that is applied to the input terminal.

4 Claims, 21 Drawing Sheets

CLASS D AMPLIFIER

PRIORITY CLAIM

This application is a divisional of U.S. patent application Ser. No. 11/376,580, filed Mar. 15, 2006, which in turn claims priority from Japanese Patent Application No. 2005-079062 filed on Mar. 18, 2005, Japanese Patent Application No. 2005-298562 filed on Oct. 13, 2005, and Japanese Patent Application No. 2006-054716 filed on Mar. 1, 2006, all of which are incorporated herein by reference.

BACKGROUND OF THE INVENTION

1. Field of the Invention

The invention relates to a class D amplifier that converts PCM (Pulse Code Modulation) sound data to a PWM (Pulse Width Modulation) signal to be amplified and output, and particularly to a class D amplifier that is designed to reduce output noise.

2. Description of Related Art

As is well known, in this type of D class amplifier, jitter within the clocks for a PWM conversion appears as output noise as it is. An arithmetic error such as discarding lower bits in the digital process at a PWM conversion contributes to output noise. In a class D amplifier in prior art, as described in Japanese Patent Publication Sho 59-183510, an output of the class D amplifier is filtered through a low pass filter so that it may be converted to an analog signal to be supplied to a load (a speaker). At the same time, the analog signal is converted to a digital signal to be fedback to an input side. However, this type of processing has a drawback that it requires a high precision A/D (analog to digital) converter, which increases the number of components and makes a circuit complex and expensive.

An amplifier has been in actual use that converts PCM sound data ("sound" here means general sound such as musical sound, without being limited to the so-called sound) to an analog signal, which in turn is converted to a PWM signal. This amplifier, which performs analog processing, can easily feedback an output. But, there is a problem in that when PWM is performed by an analog processing, it is susceptible to an extraneous signal and a signal such as input digital data.

An A/D converter is required in order to perform feedback by digital processing, which raises a problem that the cost has gone up and at the same time a complex feedback design has become difficult. Moreover, measuring power output by a count feedbacking it only deteriorates the quality of a feedback signal because of quantization noise caused at the time when a pulse width is counted and noise induced by power. Accordingly, there is another problem that output quality has not been improved.

With regard to prior art literature for a class D amplifier, Japanese Patent Publication No. 2003-249825 is known.

In the situation, there is a need to solve the problems.

SUMMARY OF THE INVENTION

The invention is directed to a class D amplifier that satisfies this need. The class D amplifier has a simple structure and can effectively reduce distortion and noise over previous generations.

A first aspect of the invention relates to a class D amplifier that comprises a PWM circuit for receiving input data and converting the input data to a PWM signal; a low pass filter (LPF) for passing only wanted frequency components of the PWM signal; a digital to analog converter for converting the input data to an analog signal; a filter for only passing wanted frequency components of the analog signal from the digital to analog converter; a difference detector for detecting a difference between a signal output from the low pass filter and a signal output from the filter; a conversion unit for converting the detected difference to digital data; and a feedback unit for feedbacking the converted digital data to an input of the PWM circuit.

Advantageously, the class D amplifier further comprises a load connected to the low pass filter.

Advantageously, the conversion unit is an analog digital converter.

Advantageously, the conversion unit is a comparator.

Preferably, the class D amplifier further comprises a delay circuit for delaying the input data by a predetermine amount of time to apply the delayed input data to the digital to analog converter.

Preferably, the class D amplifier further comprises a damping compensation filter that is provided to the input of the PWM circuit for damping a peak caused by a resonance of the amplifier.

Preferably, the class D amplifier further comprises a test signal generator for generating a test signal whose frequency successively changes to provide the test signal to the PWM circuit; an envelope measurement unit for measuring an envelope of the conversion unit; and a coefficient measurement unit for measuring a frequency response of a signal from the envelope measurement unit to thereby obtain coefficients of the damping compensation filter.

Preferably, the class D amplifier further comprises an analog input terminal for receiving an analog signal; a first switching unit for selectively supplying either the analog signal or the signal difference to the conversion unit; and a second switching unit for selectively supplying either the input data or the converted digital data to the PWM circuit.

Preferably, the filter is an anti-aliasing filter that functions as a low pass filter.

Preferably, the load is a speaker.

Preferably, the feedback unit includes one or more integrators.

A second aspect of the invention is directed to a class D amplifier that comprises a PWM circuit for receiving input data and converting the input data to a PWM signal; a power amplifier for amplifying the PWM signal; a low pass filter for passing low frequency components of the amplified PWM signal to a load; a digital to analog converter for converting the input data to an analog signal; a first filter for only passing wanted frequency components of the analog signal from the digital to analog converter; a second filter for only passing wanted frequency components of the amplified PWM signal to a load; a difference detector for detecting a difference between first filter output signal output from the first filter and second filter output signal from the second filter; a conversion unit for converting the detected signal difference to digital data; and a feedback unit for feedbacking the converted digital data to an input of the PWM circuit.

A third aspect of the invention relates to a class D amplifier that comprises a first PWM circuit for receiving input data and converting the input data to a first PWM signal; a power amplifier for amplifying the first PWM signal; a low pass filter for passing low frequency components of the amplified first PWM signal to a load; a second PWM circuit for converting the input data to a second PWM signal; a first filter for only passing wanted frequency components of the second PWM signal; a second filter for only passing wanted frequency components of the amplified first PWM signal from the power amplifier; a difference detector for detecting a difference between a first filter output signal output from the first filter and a second filter output signal output from the second filter the second filter output; a conversion unit for converting the detected signal difference to digital data; and a feedback unit for feedbacking the converted digital data to an input of the first PWM circuit.

Preferably, the conversion unit includes a dither generator for generating a dither signal; an adder for adding the dither signal to an output of the difference detector; a pulse width conversion unit for converting an output of the adder to a pulse width; and a counter for converting the pulse width to digital data.

A fourth aspect of the invention relates to a class D amplifier that comprises a PWM circuit for receiving input data and converting the input data to a PWM signal; a power amplifier for amplifying the PWM signal; a first low pass filter for passing low frequency components of the amplified PWM signal to a load; a level shifter for level-shifting the amplified PWM signal from the power amplifier to produce a pulse width; a counter for converting the pulse width from the level shifter to digital data; a second low pass filter for passing low frequency components of the digital data from the counter; and a feedback unit for feedbacking an output of the second low pass filter to an input of the PWM circuit.

Advantageously, a class D amplifier further comprises a compensation circuit coupled to the PWM circuit for compensating quantization noise from the PWM circuit; and an adder provided in place of the feedback unit for adding the output of the second low pass filter and the input data, by which an added result is applied to an input of the adder.

Advantageously, a class D amplifier further comprises a memory provided in place of the second low pass filter for storing the digital data from the counter into a memory address that corresponds to the input data of the PWM circuit, wherein the digital data in the memory is read out based on the input data to be supplied to the adder.

Advantageously, a class D amplifier further comprises a compensation circuit coupled to the PWM circuit for compensating quantization noise from the PWM circuit; an arithmetic unit provided in place of the feedback unit for detecting a difference between the output of the second low pass filter and the input data, by which a detected result is added to the quantization noise to be applied to the compensation circuit.

Advantageously, a class D amplifier further comprises a memory provided in place of the second low pass filter for storing the digital data from the counter into a memory address that corresponds to the input data of the PWM circuit, wherein the digital data in the memory is read out based on the input data to be supplied to the arithmetic unit.

Advantageously, when the digital data from the counter is stored in the memory, the storing is executed, after an average of data stored in addresses which are found around an address used for previously stored data is taken or after a low pass filter is applied.

A fifth aspect of the invention is directed to a class D amplifier comprising:

a PWM circuit for receiving input data and converting the input data to a PWM signal; a power amplifier for amplifying the PWM signal; a low pass filter for passing low frequency components of the amplified PWM signal to produce a low-pass filtered signal to a load; a level shifter for level-shifting the amplified PWM signal from the power amplifier to produce a pulse width; a counter for converting the pulse width from the level shifter to digital data; a compensation circuit coupled to the PWM circuit for compensating quantization noise from the PWM circuit; a memory for storing the digital data from the counter; a first adder for adding an output from the memory and the input data, by which an added result is applied to the compensation circuit; a digital to analog converter for converting the input data to an analog signal; a filter for only passing wanted frequency components of the analog signal from the digital to analog converter to produce a filtered analog signal; a difference detector for detecting for detecting a difference between the low-pass filtered signal to the load and the filtered analog signal; a conversion unit for converting the detected signal difference to digital data; and a second adder the digital data from the conversion unit to the compensation circuit, wherein the digital data from the counter is stored based on a memory address that corresponds to the input data to the PWM circuit, and the stored data is read out based on the input data to the PWM circuit to be added to the first adder.

A sixth aspect of the invention is directed to a class D amplifier that comprises a PWM circuit for receiving input data and converting the input data to a PWM signal; a low pass filter for passing low frequency components of the PWM signal to a load to produce a low pass filtered signal; a compensation circuit coupled to the PWM circuit for compensating quantization noise from the PWM circuit; a digital to analog converter for converting the input data to an analog signal; a filter for only passing wanted frequency components of the analog signal from the digital to analog converter to produce a filtered analog signal; a difference detector for detecting a difference between the low pass filtered signal to the load and the filtered analog signal from the filter; a conversion unit for converting the detected signal difference to digital data; and a digital filter for feedbacking the converted digital data to an input of the compensation circuit.

Advantageously, the digital filter is an IIR filter.

DETAILED DESCRIPTION OF THE INVENTION

Referring to the figures, embodiments of the invention will be described herein below.

Figure 1:
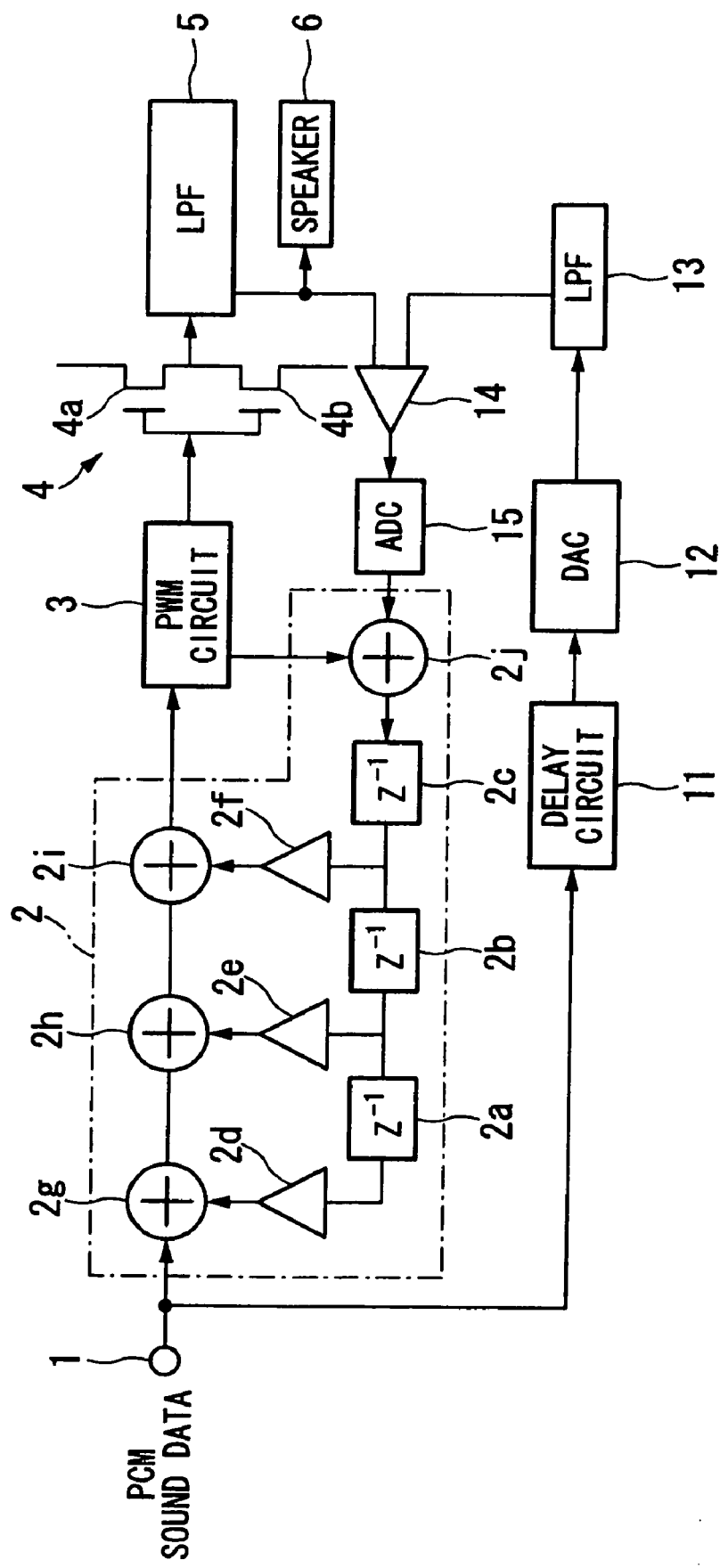
FIG. 1 is a block diagram for illustrating a structure of a class D amplifier in accordance with a first embodiment of the invention.

FIG. 1 is a block diagram for illustrating a structure of a class D amplifier in accordance with a first embodiment of the invention. In the figure, reference numeral 1 represents an input terminal for receiving PCM sound data that is obtained by digitalizing a sound signal (a "sound" here is not limited to a human voice sound itself, but means sound in general, which also includes such as musical tone); reference numeral 2, a compensation circuit; and reference numeral 3, a PWM circuit that converts sound data from the compensation circuit 2 to a PWM signal. The compensation circuit 2, which performs .DELTA..SIGMA. compensation, compensates quantization noise of the PWM circuit 3. For example, when PCM sound data is 16 bits and resolution of the PWM circuit 3 is 10 bits, quantization noise of 6 bits is produced. The compensation circuit 2 eliminates the 6-bit quantization noise by feedbacking it to an input through an integrator to add it to the PCM sound data. In the embodiment, as shown in the figure, a third order IIR filter is used as the compensation circuit 2. The third order IIR filter includes an adder 2j for adding the 6-bit quantization noise of the PWM circuit 3 and an output from an analog to digital converter (called an "ADC" hereinbelow) 15; serially connected one-clock delay circuits 2a, 2b and 2c that receive an output from the adder 2j; multipliers 2d, 2e, and 2f for multiplying each output of the delay circuits 2a-2c by a constant; and adders 2g, 2h, and 2i for sequentially adding each output of the multipliers 2d-2f to the PCM sound data.

The PWM circuit 3 contains a carrier signal generator therein for generating a sawtooth (or triangle) carrier signal. By comparing the carrier signal with the sound data from the compensation circuit 2, the PWM circuit 3 produces and outputs a PWM signal. Reference numeral 4 represents an output switching circuit consisting of serially connected power FETs (the FET stands for Field Effect Transistor) 4a and 4b; reference numeral 5, a low pass filter (LPF) that, comprising a coil and a capacitor, converts an output from the output switching circuit 4 to an analog sound signal; and reference numeral 6, a speaker (or a load) that receives an output from the LPF 5.

Reference numeral 11 denotes a delay circuit for delaying the PCM sound data by a predetermined time; reference numeral 12, a digital to analog converter (called a "DAC" hereinbelow) for converting an output from the delay circuit 11 to an analog signal; and reference numeral 13, a low pass filter. The LPF 13 has the same characteristics as those of the LPF 5 when it is assumed to be ideal. Reference numeral 14 is a differential amplifier for amplifying a difference between the output of the LPF 5 and the output of the LPF 13, and reference numeral 15 is an ADC for converting an output of the differential amplifier 14 to digital data.

Figure 2:
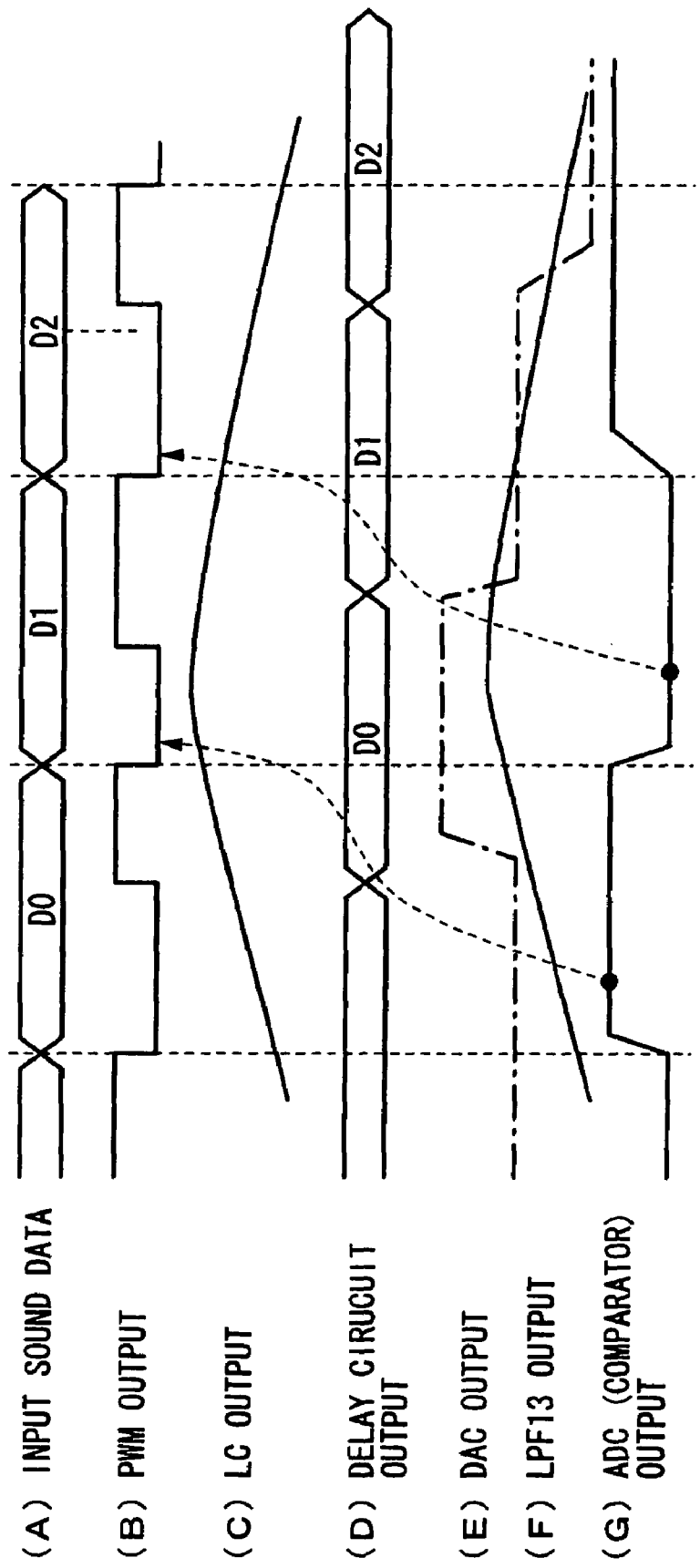
FIG. 2 shows a waveform at each of selected portions of the class D amplifier in accordance with the first embodiment of the invention.

FIG. 2 shows a waveform at selected portions of the class D amplifier in accordance with the first embodiment of the invention. Referring to the waveforms shown in FIG. 2, an operation of the above-mentioned class D amplifier will be described.

Sound data ((A) of FIG. 2) applied to the input terminal 1 is supplied to the PWM circuit 3 via the compensation circuit 2, from which a PWM signal ((B) of FIG. 2) is output. The PWM signal is converted to an analog signal ((C) of FIG. 2) through the LPF 5, which is delivered to the speaker 6.

On the other hand, the PCM sound data is delayed by the delay circuit 11 ((D) of FIG. 2), and is converted to an analog sound signal by the DAC 12 ((E) of FIG. 2). The analog sound signal passes through the LPF 13 with the higher components thereof removed ((F) of FIG. 2), and then is supplied to the differential amplifier 14. The reason why the delay circuit 11 is used here is that a phase of the signal applied to the speaker 6 can match that of the signal from the LPF 13, taking into consideration processing time by the compensation circuit 2 and the PWM circuit 3 and delay time caused by the LPF 5 and the speaker 6.

The differential amplifier 14 amplifies a difference between the output signal from the LPF 5 and that from the LPF 13. Then the amplified difference is supplied to the ADC 15. The output from the differential amplifier 14 corresponds to a waveform distortion caused by the LPF 5, the speaker 6, the compensation circuit 2, and the PWM circuit. The ADC 15 converts the output signal from the differential amplifier 14 to digital data ((G) of FIG. 2), which is furnished to the compensation circuit 2. This adds a compensated value based on the output from the ADC 15 to subsequent PCM sound data that is to be applied to the terminal 1. In this way, the difference between the output signal from the LPF 13 and the output signal from the LPF 5, i.e., the signal applied to the speaker 6, is controlled to be minimal.

As described above, according to the class D amplifier in FIG. 1, the signal applied to the speaker 6 is not directly fedback to the input by converting to digital data; instead, a difference between the LPF output signal and the speaker input signal is obtained, and the obtained difference signal is fedback to the input after being converted to digital data. Accordingly, the level of the fedback signal is quite small compared with that of the speaker input signal. This requires less number of bits for the ADC 15. Instead of the ADC 15, a comparator (one bit ADC), which compares a constant level with a signal to detect whether the signal is larger or smaller than the constant level, may be used.

The above-mentioned class D amplifier can be constructed at low cost, using the relatively low-cost DAC 12 and the ADC 15 having less number of bits or a comparator. In addition, since a digital filter enables a high order filter easily, feedback characteristics can be designed at will.

A second embodiment of the invention will be described next.

Figure 3:
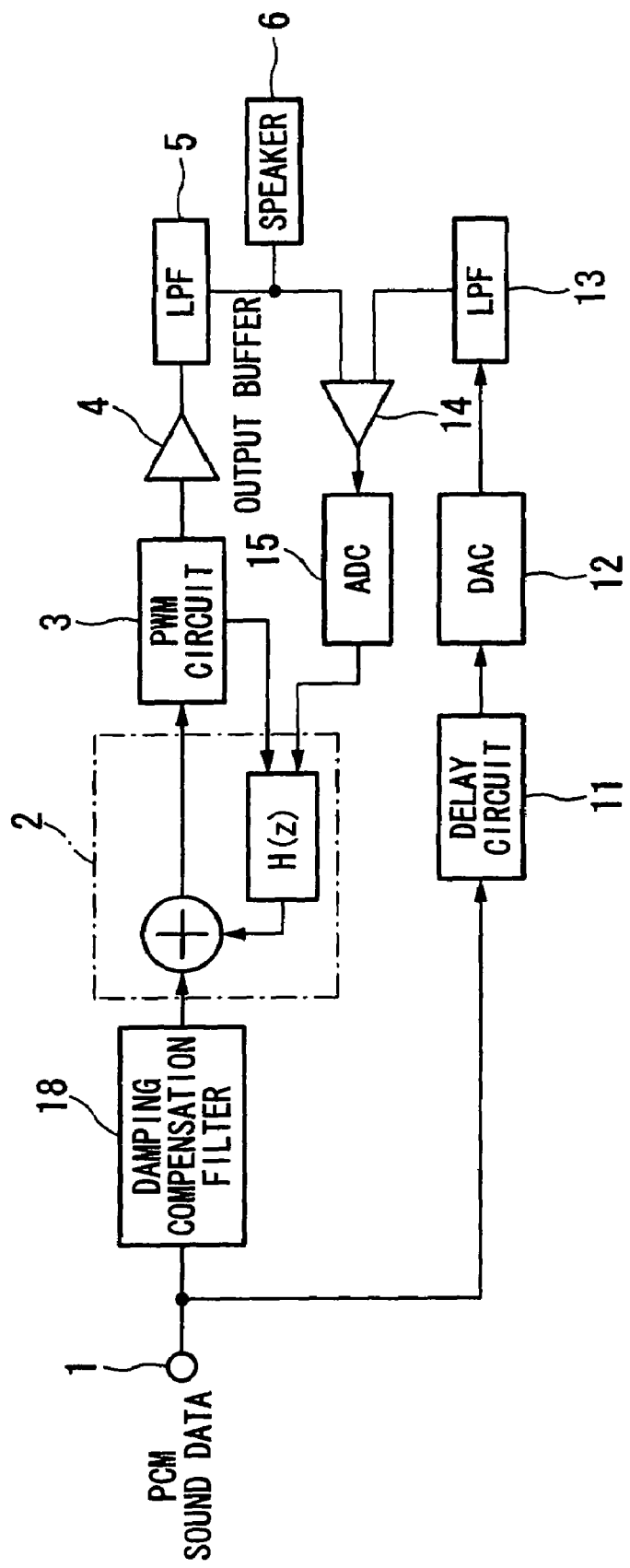
FIG. 3 is a block diagram for illustrating a structure of a class D amplifier in accordance with a second embodiment of the invention.

FIG. 3 is a block diagram for illustrating a structure of a class D amplifier in accordance with a second embodiment of the invention. The difference between the second embodiment and the first embodiment shown in FIG. 1 is that a damping compensation filter 18 is provided in front of the compensation circuit 2 in the former.

Figure 4:
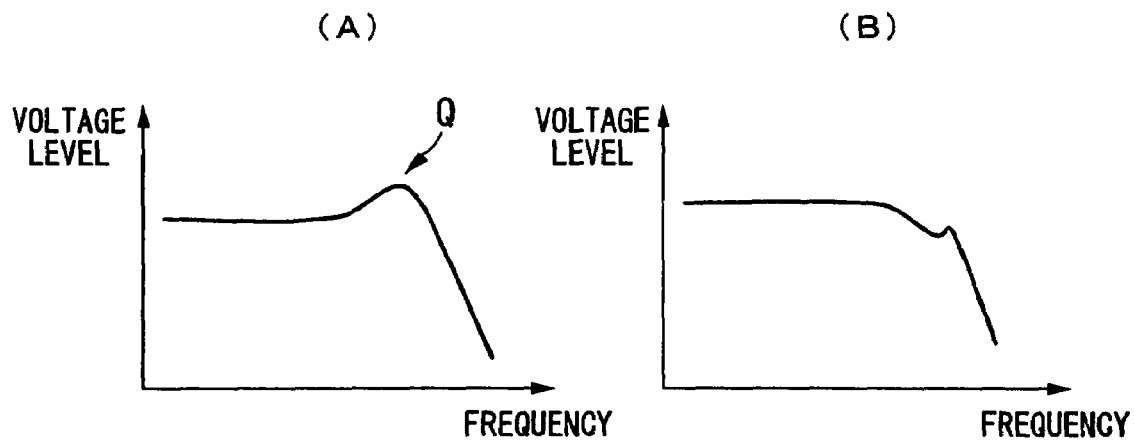
FIG. 4 are waveforms for illustrating damping components appearing in an output signal from a LPF.

FIG. 4 shows waveforms for illustrating a peak appearing in an output signal from the LPF.

In the first embodiment described above, since the LPF 5 connected to the output switching circuit 4 is an LC circuit, the speaker 6 may have a resonance, which, as shown in (A) of FIG. 4, produces a peak in an output signal from the LPF 5, featured by a quality factor Q. On the other hand, an output signal from each of the DAC 12 and the LPF 13 can be made to be smooth without ringing as characteristics. Therefore, the peak featured by the quality factor Q appears in the output from the differential amplifier 14. It is possible to suppress a peak represented by the quality factor Q, using a feedback loop consisting of the ADC 15 and the compensation circuit 2. In order to suppress such noise having a high voltage level by the use of the feedback loop, an open-loop gain should be high.

Consequently, in the second embodiment, as described above, the damping compensation filter 18 is provided in front of the compensation circuit 2 to curb the influence of the quality factor Q (refer to (B) of FIG. 2).

The damping compensation filter 18 consists of an FIR filter or an IIR filter. For example, with respect to coefficients of an FIR filter, a frequency response of "the LPF 5+the speaker 6" is obtained from the impedances of the LPF 5 and the speaker 6 by the Fast Fourier Transform (FFT). The coefficients can be acquired from the obtained frequency response.

Figure 5:
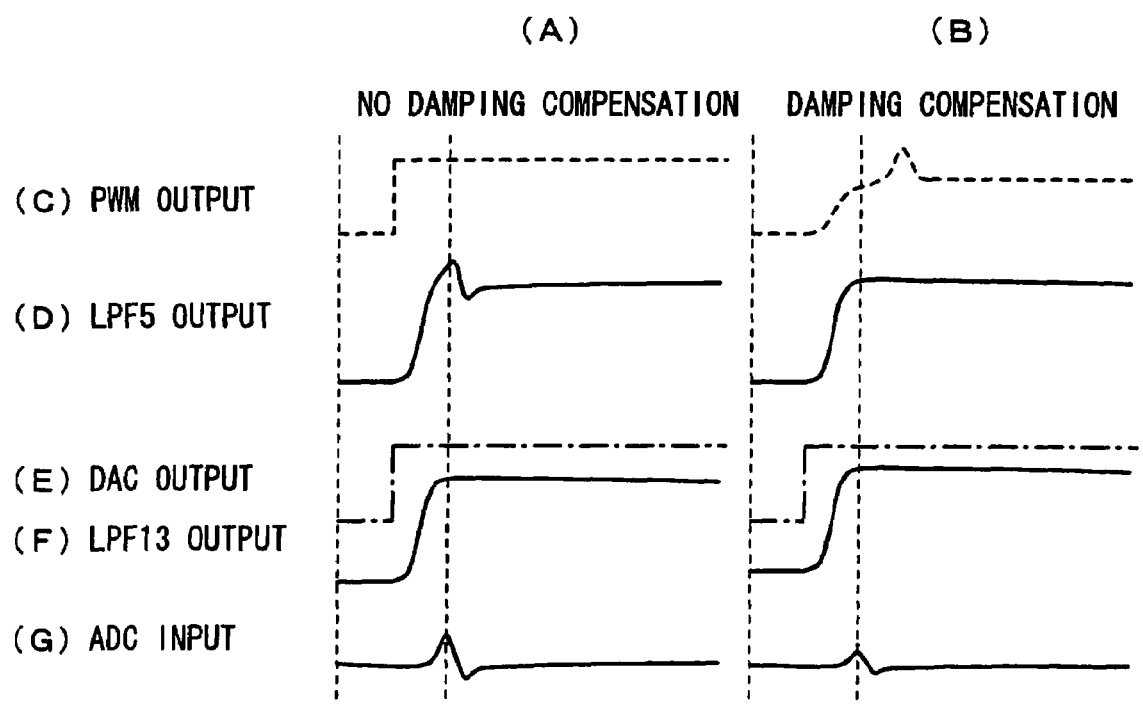
FIG. 5 are waveforms for illustrating an operation of the class D amplifier shown in FIG. 3.

FIG. 5 shows a waveform at each of selected portions for illustrating the operation of the class D amplifier shown in the second embodiment. (A) of FIG. 5 represents the waveforms at each portion when no damping compensation filter 18 is provided; (B) of FIG. 5, the waveforms at each portion when a damping compensation filter 18 is provided. (C) of FIG. 5 shows the output of the PWM circuit 3; (D) of FIG. 5, the output of the LPF 5; (E) of FIG. 5, the output of the DAC 12; (F) of FIG. 5, the output of the LPF 13; and (G) of FIG. 5, the output of the ADC 15. As is clearly shown from the figure, the damping compensation filter 18 can eliminate the influence of the quality factor Q to allow an open-loop gain to be reduced.

Figure 6:
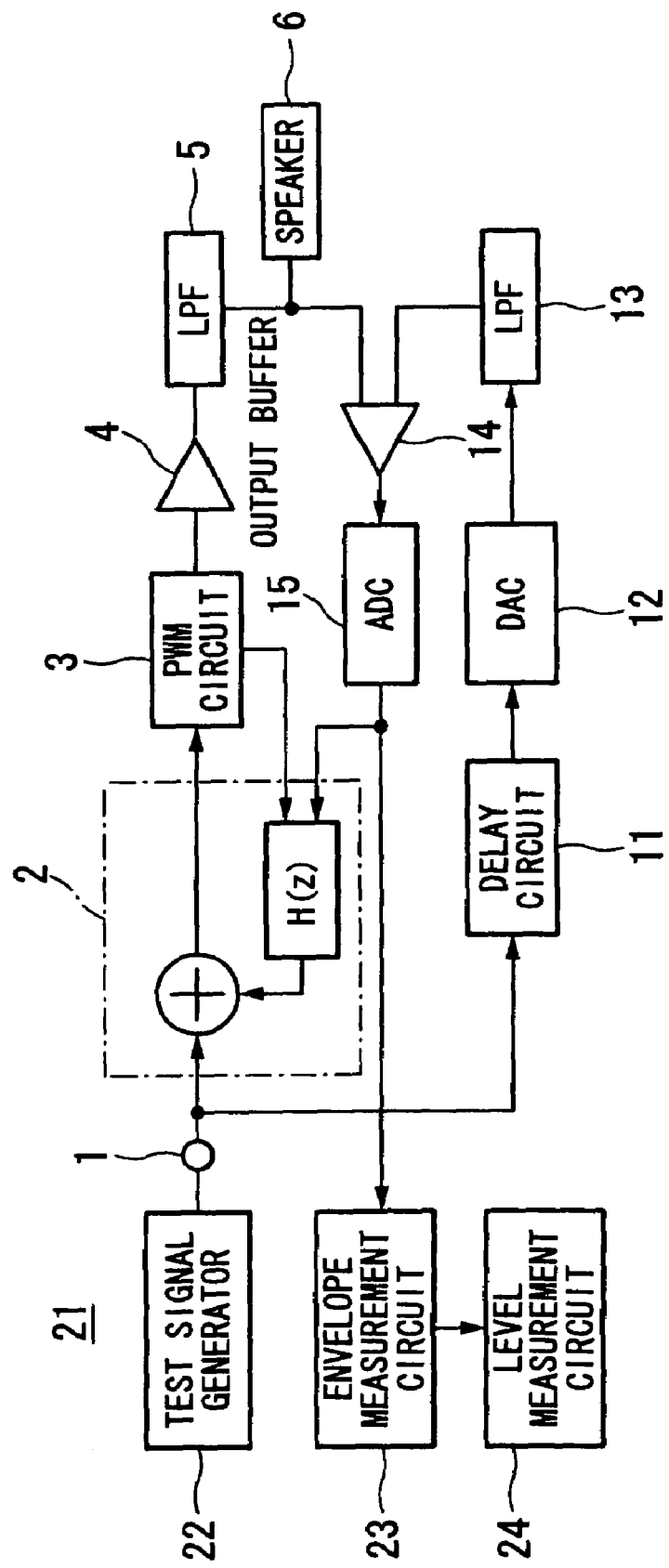
FIG. 6 is a block diagram for illustrating a structure of a coefficient measurement circuit, by which coefficients of a damping compensation filter shown in FIG. 3 are obtained.

FIG. 6 is a block diagram for illustrating a structure of a coefficient measurement circuit, by which coefficients of a damping compensation filter shown in FIG. 3 are obtained.

Figure 7:
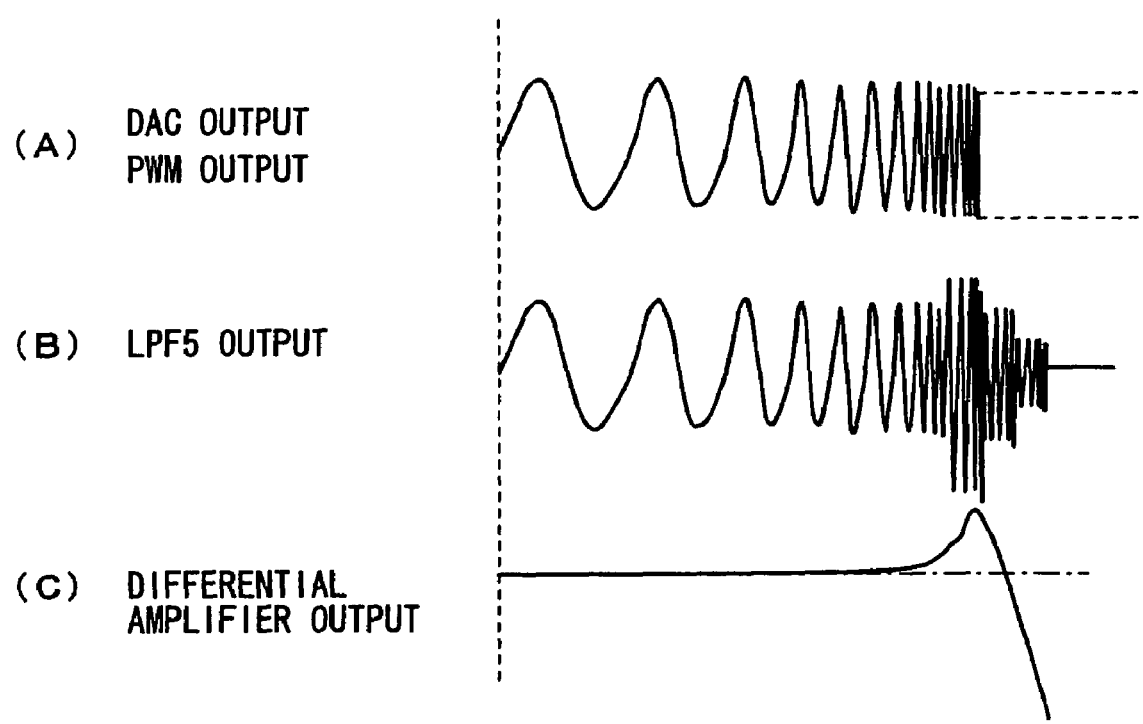
FIG. 7 are waveforms for illustrating an operation of the coefficient measurement circuit shown in FIG. 6.

FIG. 7 are waveforms at selected portions for illustrating an operation of the coefficient measurement circuit shown in FIG. 6.

When an impedance of the speaker 6 is unknown, as shown in FIG. 6, a coefficient measurement circuit 21 should be provided that contains a test signal generator 22, an envelope measurement circuit 23, and a level measurement circuit 24. The test signal generator 22 delivers to the input terminal 1a a sine wave (PCM data) whose frequency changes continuously. When the sine wave is applied to the input terminal 1, a signal from each of the PWM circuit 3 and the DAC 12, as shown in (A) of FIG. 7, becomes a sine wave whose frequency varies successively. A signal from the LPF 5, as shown in (B) of FIG. 7, has a peak at a resonant frequency. As a result of (C) of this, a signal from the differential amplifier, as shown in (B) of Figure, has a peak in its waveform, which is converted to digital data by the ADC 15 to be supplied to the envelope measurement circuit 23.

The envelope measurement circuit 23 integrates an output of the ADC 15 to obtain an envelope thereof, which is furnished to the level measurement circuit 24. The level measurement circuit 24 measures an level, for example, a voltage level of the envelope and performs the operation of the Fast Fourier Transform (FFT). Using the result of the FFT operation, filter coefficients of the damping compensation filter 18 can be acquired.

The coefficient measurement circuit 21 may be provided in a factory for producing a class D amplifier, and at the time of shipping the class D amplifier, the filter coefficients of the damping compensation filter 18 may be set. It is also acceptable to have filter coefficients built in a class D amplifier, so that an automatic measurement and setting of the filter coefficients can be performed. By doing so, regarding the class D amplifier, a user himself can set the filter coefficients, for example, when he changes the speakers 6.

A third embodiment of the invention will be described.

Figure 8:
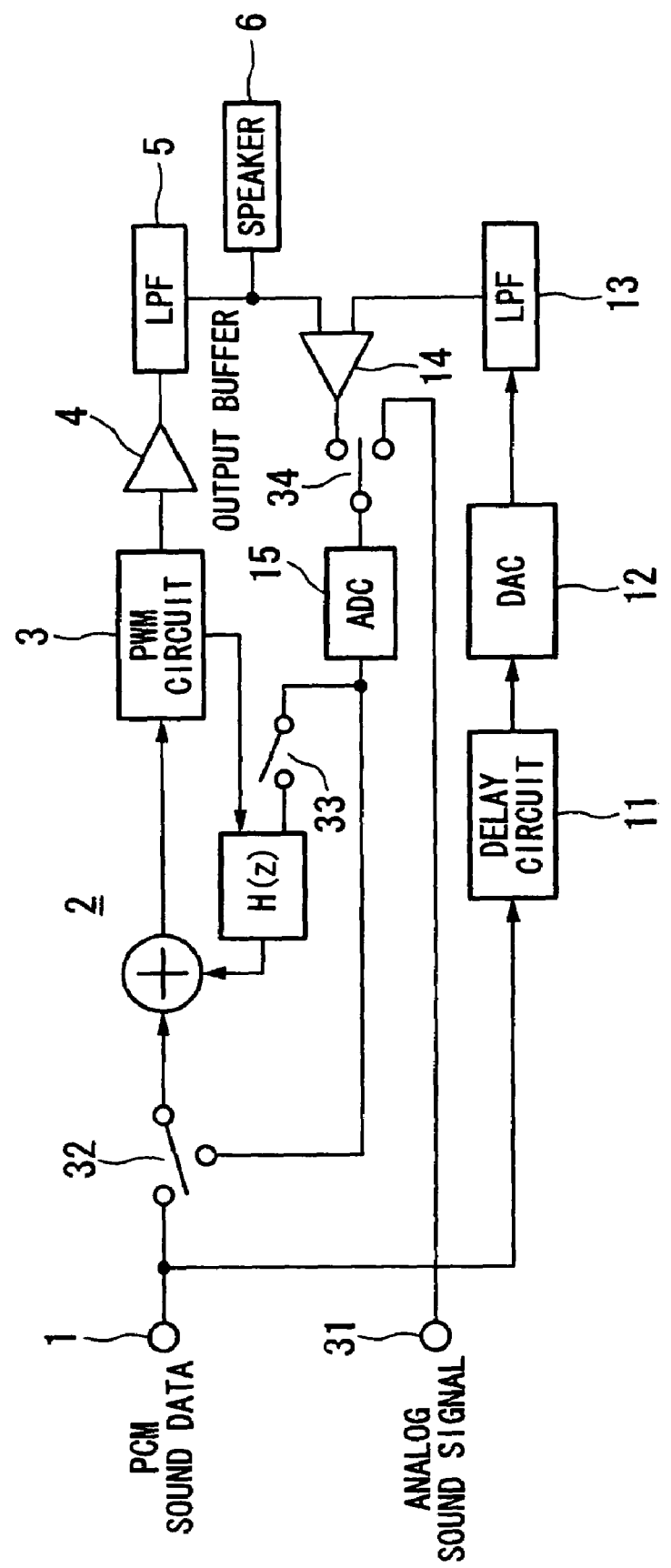
FIG. 8 is a block diagram for illustrating a structure of a class D amplifier in accordance with a third embodiment of the invention.

FIG. 8 is a block diagram for illustrating a structure of a class D amplifier in accordance with a third embodiment of the invention. The third embodiment is different from the first embodiment in the following points. Firstly, the third embodiment includes an analog switch 31. Secondly, the third embodiment includes switches 32-34. That is, a first contact of the switch 32 is connected to the input terminal 1; a second contact, the output terminal of the ADC 15; and a common contact, an input of an input terminal of the compensation circuit 2.

A first contact of the switch 33 is connected to the compensation circuit 2, while a second contact is connected to the output terminal of the ADC 15. A common contact of the switch 34 is connected to the input of the ADC 15; a first contact, the output terminal of the differential amplifier 14; and a second contact, the analog input terminal 31.

Using the arrangement described above as an amplifier for amplifying PCM sound data, the first contact of the switch 32 is connected to the common contact thereof, the switch 33 is turned on, and the first contact of the switch 34 is connected to the common contact thereof. When the switches are connected as mentioned above, respectively, the circuit of FIG. 8 becomes identical to that of FIG. 1.

When the D class amplifier is used for amplifying an analog sound signal, the second contact of the switch 32 is connected to the common contact thereof, the switch 33 is off, and the second contact of the switch 34 is connected to the common contact thereof. With the switches connected in this way, when an analog sound signal is applied to the analog input terminal 31, it is furnished to the ADC 15 via the switch 34 to be converted to digital music data by the ADC 15. Then, the digital music data is furnished to the PWM circuit 3 through the switch 32 and the compensation circuit 2. The PWM circuit 3 converts the music data to a PWM signal, which is applied to the speaker 6 via the output switching circuit 4 and the LPF 5. In the arrangement, the differential amplifier 14 cannot be used to constitute a feedback loop, but instead can be used to compensate quantization noise by the compensation circuit 2.

Figure 9:
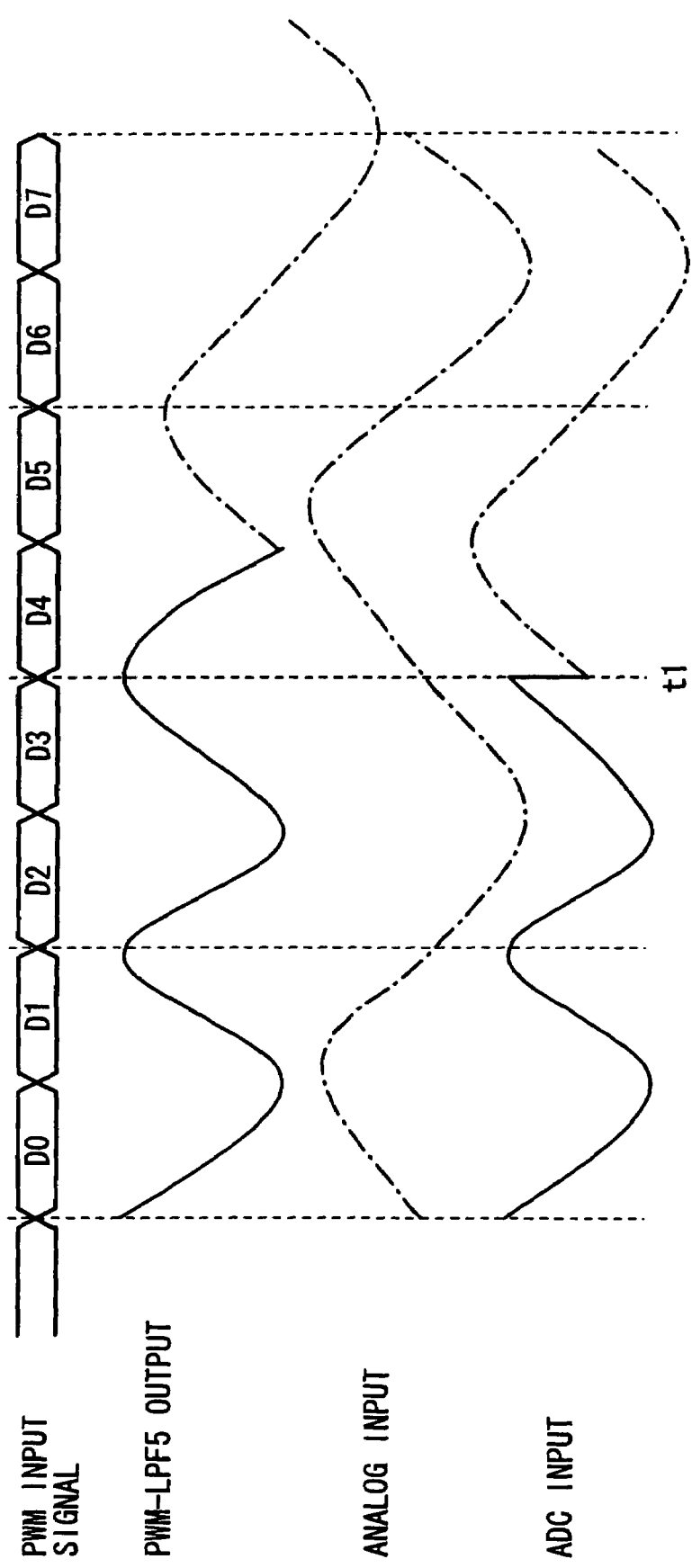
FIG. 9 are waveforms for illustrating an operation of the class D amplifier shown in FIG. 8.

FIG. 9 shows waveforms at each section when a digital signal is converted to an analog signal at time t1.

A fourth embodiment in accordance with the invention will be explained.

Figure 10:
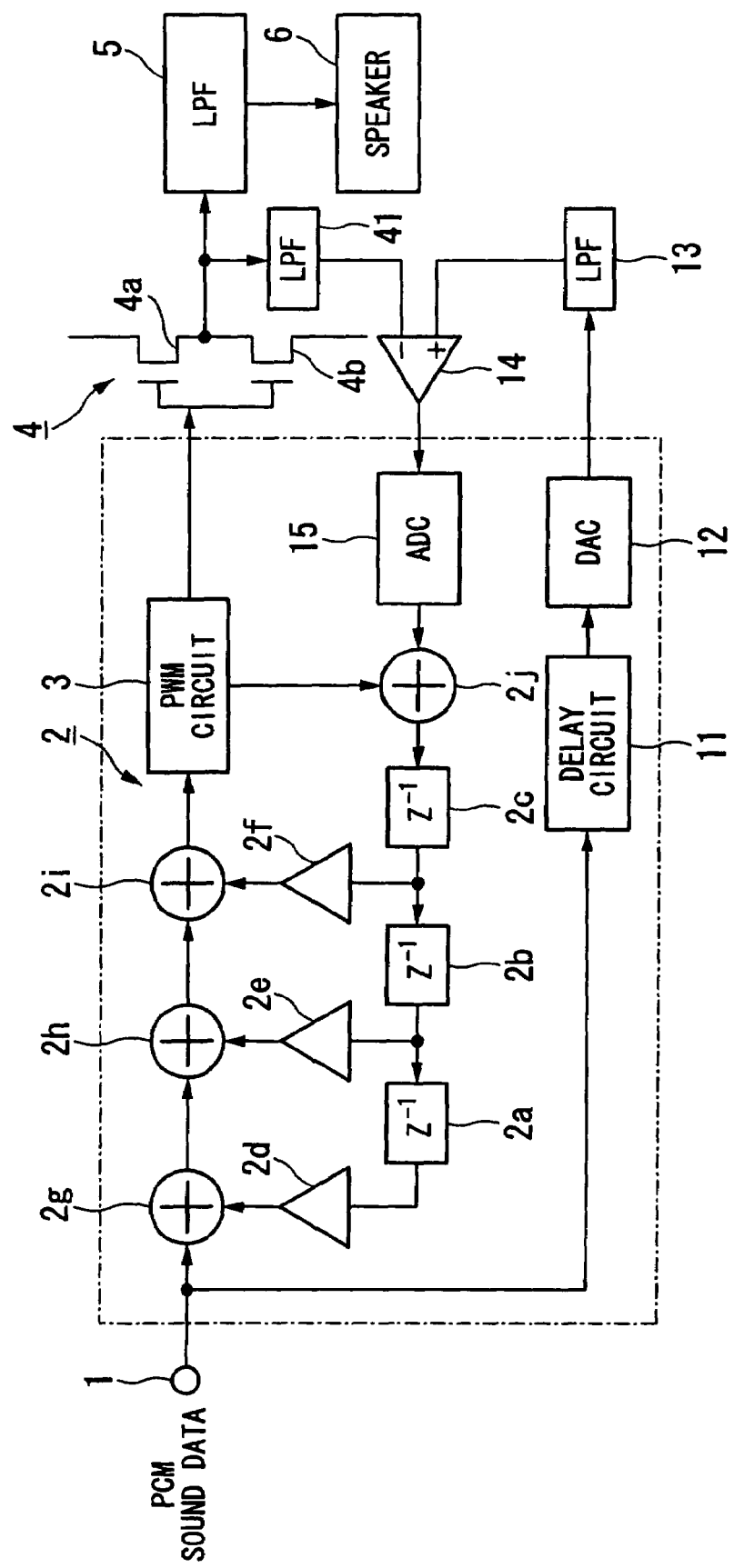
FIG. 10 is a block diagram for illustrating a structure of a class D amplifier in accordance with a fourth embodiment of the invention.

FIG. 10 is a block diagram for illustrating a structure of a class D amplifier in accordance with a fourth embodiment of the invention. The difference between the fourth embodiment in FIG. 10 and the first embodiment in FIG. 1 is that in the former, an output from the switching circuit 4 is applied to the differential amplifier 14 via a low pass filter (LPF) 41 that has the same characteristics as those of the LPF 5, while in the latter an output from the LPF 5 is furnished to the differential amplifier 14. The fourth embodiment cannot suppress the distortion of the LPF 5, but can suppress the distortion of the switching circuit 4. Since load variation need not be taken into consideration, there is an advantage that loop design becomes easier.

When the LPF 13 and the LPF 41 have the identical characteristics, they do not have to be identical to those of the LPF 5. The LPF 13 and the LPF 41 may be the same circuit to input a difference.

A fifth embodiment of the invention will be described.

Figure 11:
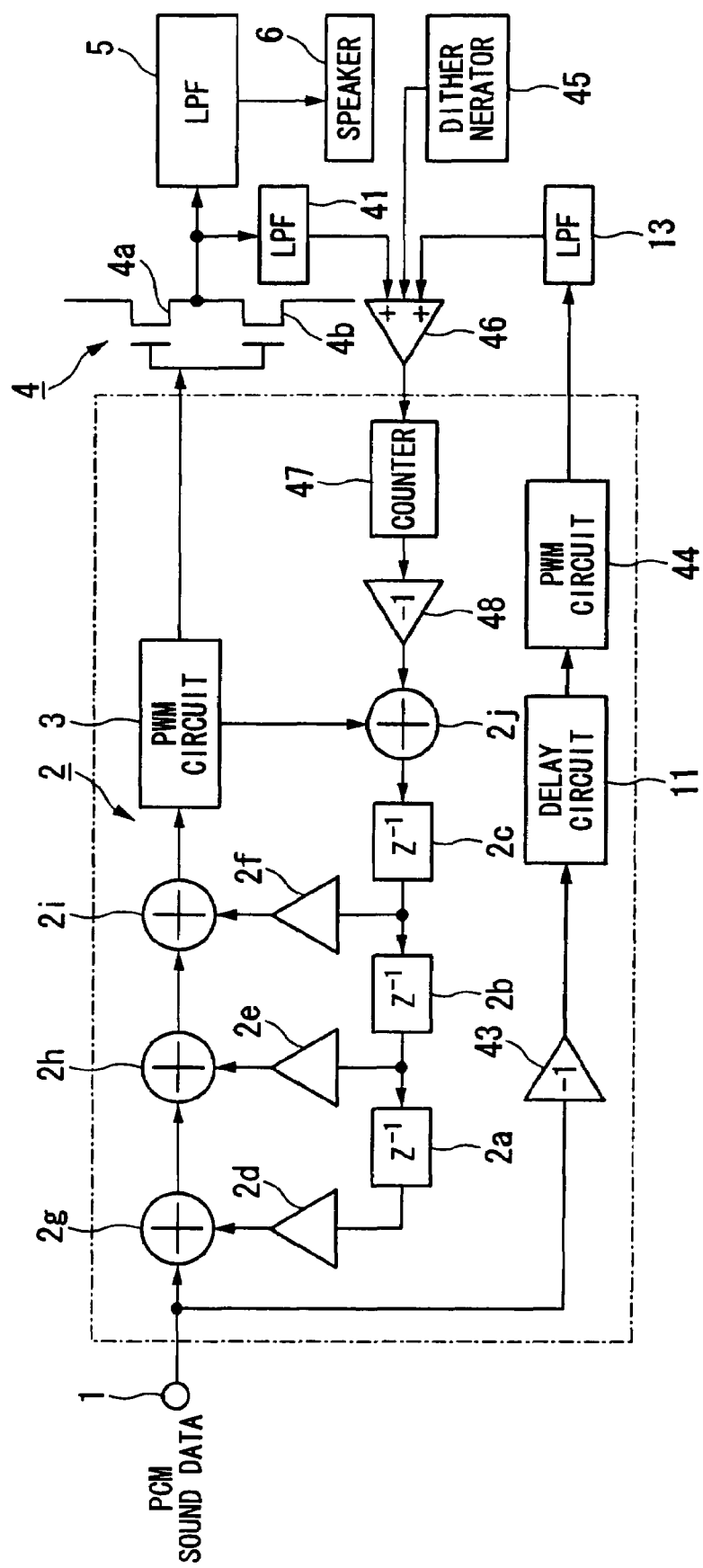
FIG. 11 is a block diagram for illustrating a structure of a class D amplifier in accordance with a fifth embodiment of the invention.

FIG. 11 is a block diagram for illustrating a structure of a class D amplifier in accordance with a fifth embodiment of the invention. The differences between the fifth embodiment and the fourth embodiment are as follows. First, in the former, a multiplier 43 is provided for multiplying the sound data at the input terminal 1 by −1 before the delay circuit 11. Second, a PWM circuit 44 is provided in place of the DAC 12. Third, a dither generator 45 is newly provided. Fourth, an adder and comparator 46 is provided that consists of an adder for adding an output from the LPF 41, an output from the dither generator 45, and from an output from the LPF 13, and a comparator for converting the added results to a pulse width. Fifth, a counter 47 and a multiplier 48 are provided, in which the counter 47 count the clock pulse from the PWM circuit 3 when the output from the adder and comparator 46 is "H (high)" and the multiplier 48 multiplies an output form the counter 47 by −1.

Figure 12:
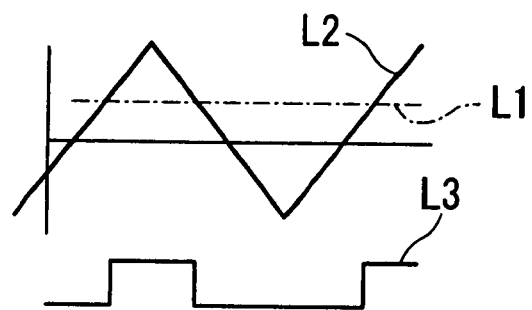
FIG. 12 is a set of waveforms for illustrating each function of a dither generator and an adder & comparator shown in FIG. 11.

FIG. 12 is a set of waveforms for illustrating each function of a dither generator and an adder & comparator shown in FIG. 11. Since an output from the PWM circuit 44 corresponds to an inverted signal of an output of the switching circuit 4, an error can be extracted between the output from the PWM circuit 44 and the output from the switching circuit 4, by adding each output from the LPF 41 and the LPF 13. The error, shown by a symbol L1 in FIG. 12, may be a DC component voltage or a non-inverted voltage, which may not activate the comparator in the adder and comparator 46. In this case, the counter 47 does not work, so that it does not produce an output representing the error. Applying a signal denoted by symbol L2 such as a triangular dither by the dither generator 45 to the adder and comparator 46 makes the comparator work. This produces from the adder and comparator 46 a PWM signal represented by L3 to which the error is converted. Synchronizing a triangular dither with the PWM period and counting the signal based on the PWM period by the counter 47 can make the error digital data that is synchronized with the PWM period.

With respect to the embodiment, replacing the DAC 12 in FIG. 10 by the PWM circuit 44 and the ADC 15 by the counter 47 can reduce the cost. When input data of the PWM circuit 44 is multiplied by −1 and an output from the counter 47 is multiplied by −1, the differential amplifier 14 in FIG. 10 can be replaced by the adder and comparator 46. After a dither (a triangle wave or random noise) is added to each output of the LPF 41 and the LPF 13, whose added results are converted to a pulse width, resolution will be improved when the counter 47 counts based on the PWM period. Accordingly, no ADC 14 is required. Moreover, in place of multiplying the input data of the PWM circuit 44 by −1, an output from the PWM circuit 44 may be inverted.

Figure 13:
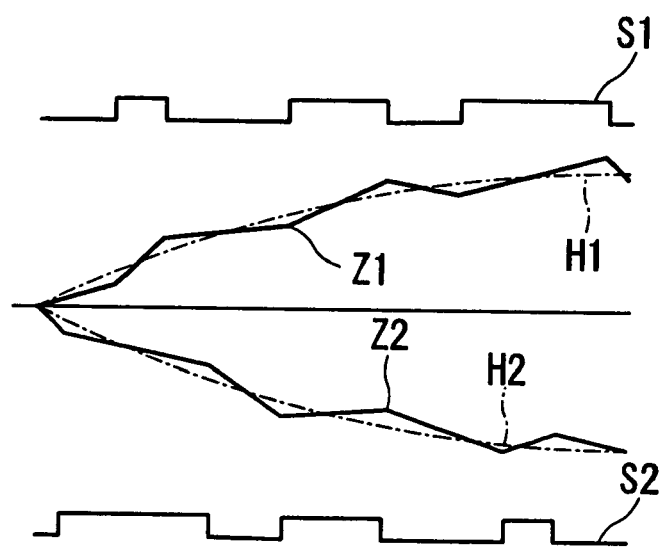
FIG. 13 is a set of waveforms for illustrating an operation of the embodiment shown in FIG. 11.

FIG. 13 is a set of waveforms for illustrating an operation of the embodiment shown in FIG. 11. In the embodiment mentioned above, referring to FIG. 13, a case will be described where time a time constant (a cutoff frequency) of the LPF 13 and the LPF 41 is set at a value (approximately ten times to one tenth) close to the PWM frequency of the PWM circuit 3.

In FIG. 13, symbols S1 and S2 denote an output of the switching circuit 4 and the PWM circuit 44, respectively. Symbols Z1 and Z2 represent each output of the LPF 41 and the LPF 13, respectively. Symbols H1 and H2 show envelopes of the solid lines Z1 and Z2, respectively. As shown in FIG. 13, the envelopes H1 and H2 are canceled, and the residues (solid lines Z1 and Z2) of the PWM wave are compared mutually. There is no error in a stable state, in which a signal having a duty of 50% can be obtained as a result of adding each output of the LPF 41 and the LPF 13. Electric power variation and offset is detected as an error in the added results of each output of the LPF 41 and the LPF 13.

Figure 14:
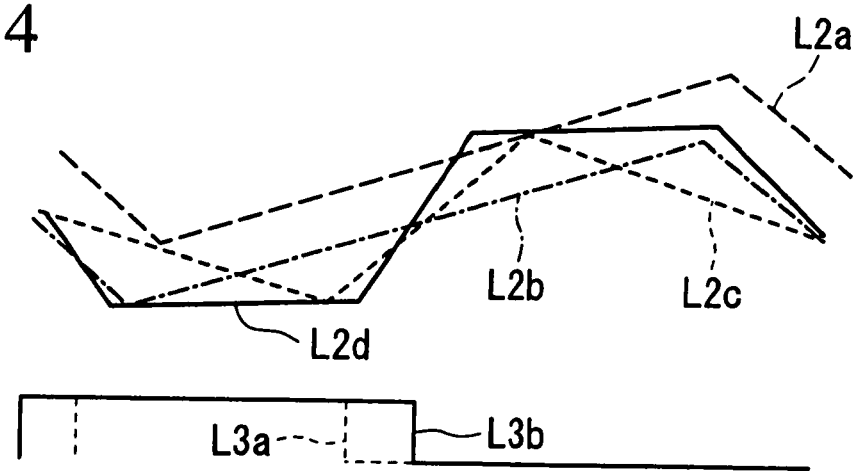
FIG. 14 is a set of waveforms for illustrating an operation of the embodiment shown in FIG. 11.

FIG. 14 is a set of waveforms for illustrating an operation of the embodiment shown in FIG. 11. The added results of each output of the LPF 41 and the LPF 13 in a stable state are shown by the long-dashed line L2a in the figure. When an offset is produced, the added results are shifted to be shown by the dot-dashed line L2b. When a gain varies, a PWM signal is varied to be represented by the short-dashed line L2c, whose apexes are changed. In the situation, when the long-dashed line L2a and the short dashed line L2c are added, a trapezoidal signal shown by the solid line L2d is created. Converting the trapezoidal signal to a PWM signal by a comparator generates a signal shown by the solid line L3b. Since a PWM signal when there is no error (symbol L2a) is represented by the dashed line L3a, an error is indicated as a difference in pulse width of the signals L3a and L3b. The error may be extracted by counting the difference based on the PWM clock through the counter 47. This improves resolution substantially. As a consequence, since the resolution that is equivalent to the output PWM is obtained without adding dither, the noise shaper (compensation circuit 2) can suppress noise.

Figure 24:
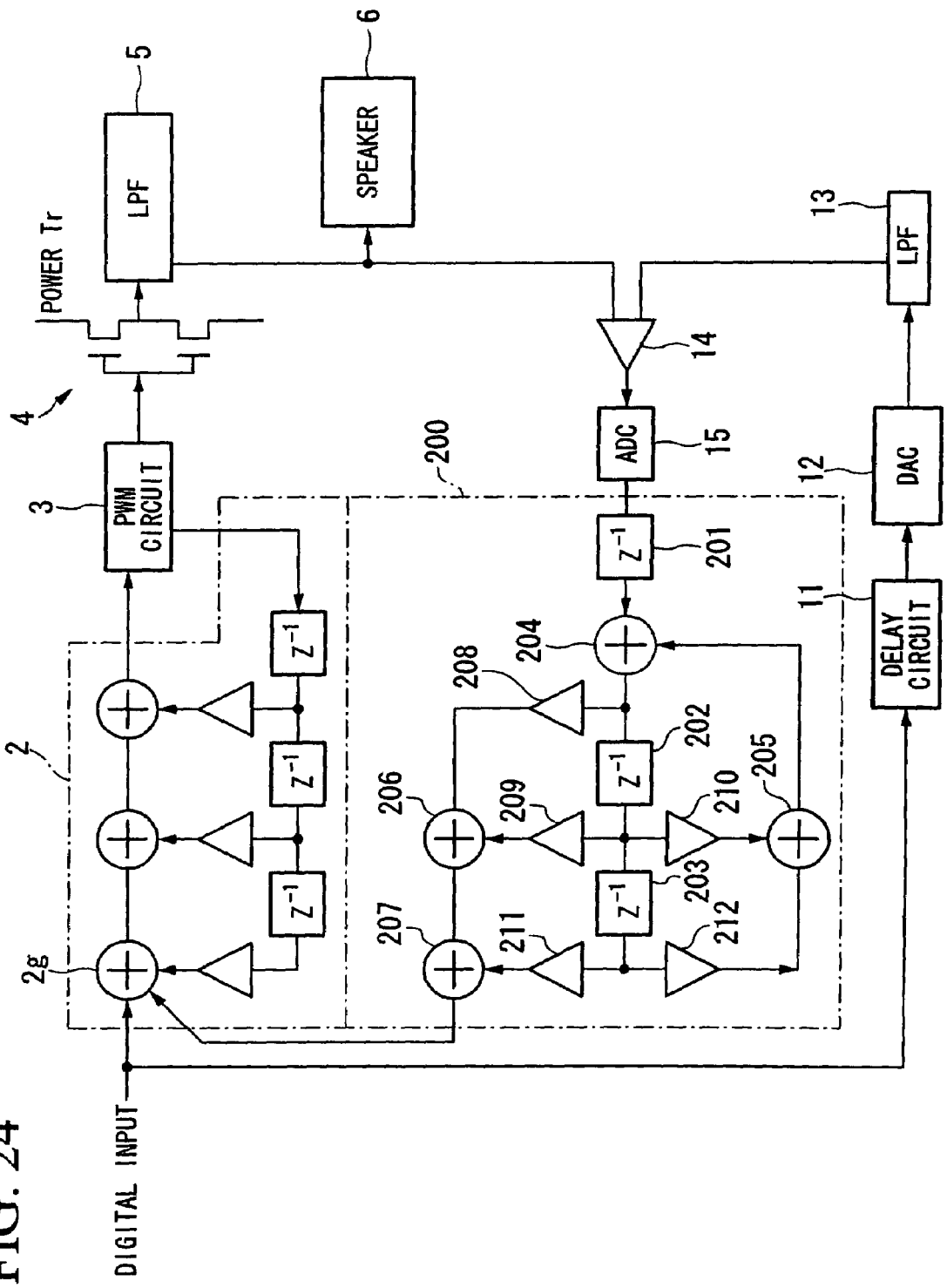
FIG. 24 is a block diagram for illustrating a variation of the first to fifth embodiments of the invention.

FIG. 24 is a block diagram for illustrating a variation of the first to fifth embodiments of the invention. In the first to fifth embodiment described above, in order to feedback the output of the ADC 15 to the input of the PWM circuit 3, the compensation circuit 2 shown in FIG. 1 is used, to which the output of the ADC 15 is applied. However, to have a feedback characteristic that is different from the compensation circuit 2, as shown in FIG. 24, the output of the ADC 15 should be connected to a digital filter 200 that is different from the compensation circuit 2, and the output of the digital filter 200 should be added to the adder 2g of the compensation circuit 2. The digital filter 200 is an IIR filter, consisting of delay circuits 201-203 for delaying by one clock, adders 204-207, and multipliers 208-212.

As is clear from FIG. 24, the PWM circuit 3 is directly connected to the compensation circuit 2, which produces no delay. However, there is plenty of delay between the PWM circuit 3 and the output of the ADC 15 because there are the switching circuit 4, the low pass filter 5, the differential amplifier 14, and the ADC 15 therebetween. Because of this, phase compensation is required between the output of the ADC 15 and the input of the compensation circuit 2. Since a configuration shown in FIG. 24 includes the digital filter 200 apart from the compensation circuit 2, independent feedback characteristic can be freely designed, which enables more efficient and stable characteristics.

A sixth embodiment of the invention will be discussed below.

Figure 15:
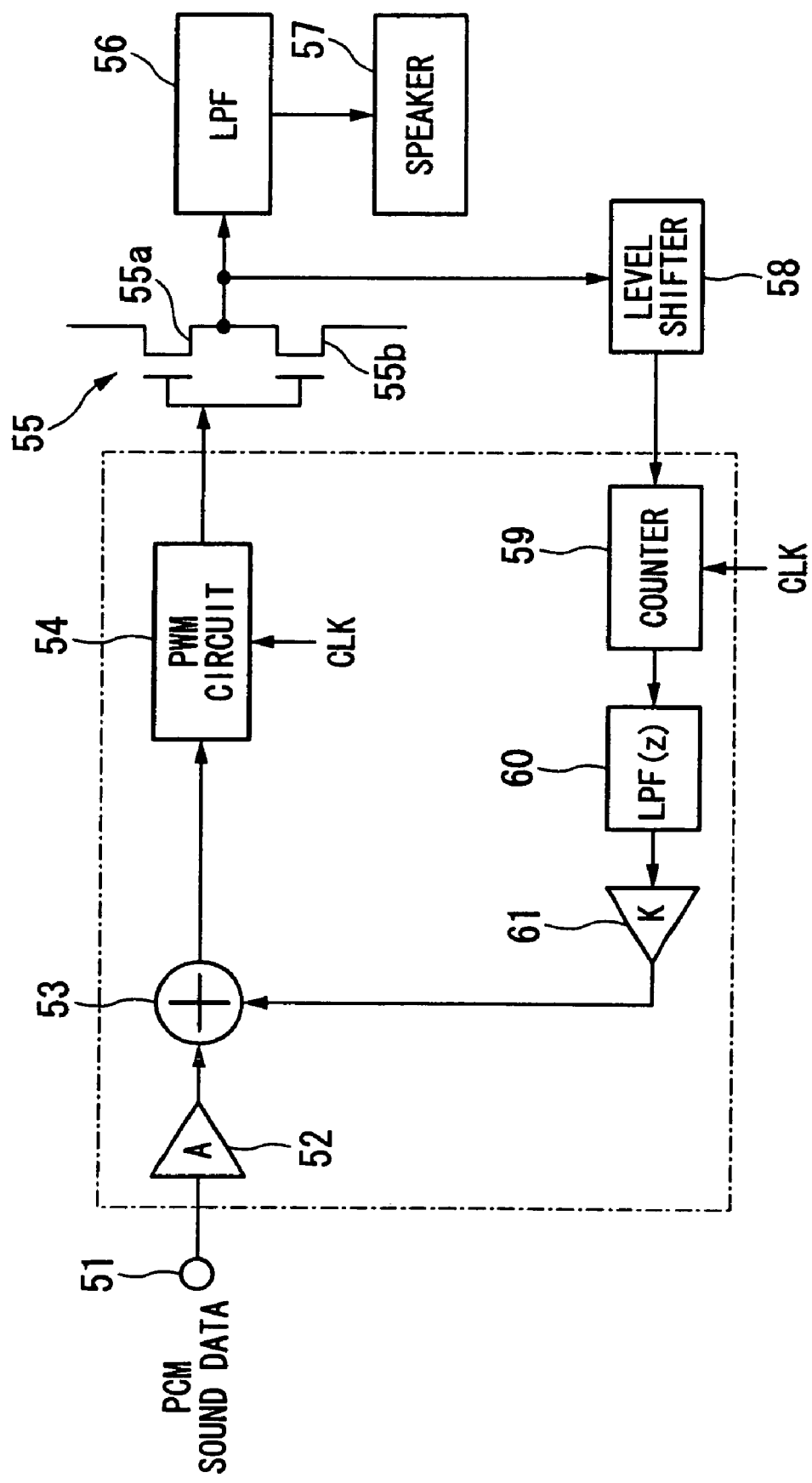
FIG. 15 is a block diagram for illustrating a structure of a class D amplifier in accordance with a sixth embodiment of the invention.

FIG. 15 is a block diagram for illustrating a structure of a class D amplifier in accordance with a sixth embodiment of the invention. In the figure, reference numeral 51 denotes an input terminal for PCM sound data; reference numeral 52, a multiplier for multiply the PCM sound data by a constant coefficient A; reference numeral 53, an adder; and reference numeral 54, a PWM circuit. The PWM circuit 54, which is constructed similar to the PWM circuit 3 in FIG. 1, converts the sound data from the adder 53 to a PWM signal based on the clock pulse CLK. Reference numeral 55 designates a switching circuit consisting of serially connected power transistors Trs 55a and 55b; reference numeral 56, a low pass filter (LPF), consisting of a LC circuit of coils and capacitors, to transform an output from the switching circuit 55 to analog sound signal; and reference numeral 57, a speaker (a load) that receives an output from the LPF 56.

Reference numeral 58 represents a level shifter for shifting a voltage level of an output form the switching circuit 55 by resistance division, so that the level shifted voltage can be applied to an input of a digital LSI. Generally, the amplitude of the level shifted voltage may range 5V-3.3V-1.6V. Reference numeral 59 is a counter for carrying out upcount of the clock pulse CLK when an output of the level shifter 58 is "H (high)." This regenerates an output value of the PWM. Added to the counted value is an error derived from an output from the PWM circuit 54 affected by the switching circuit 55.

Figure 16:
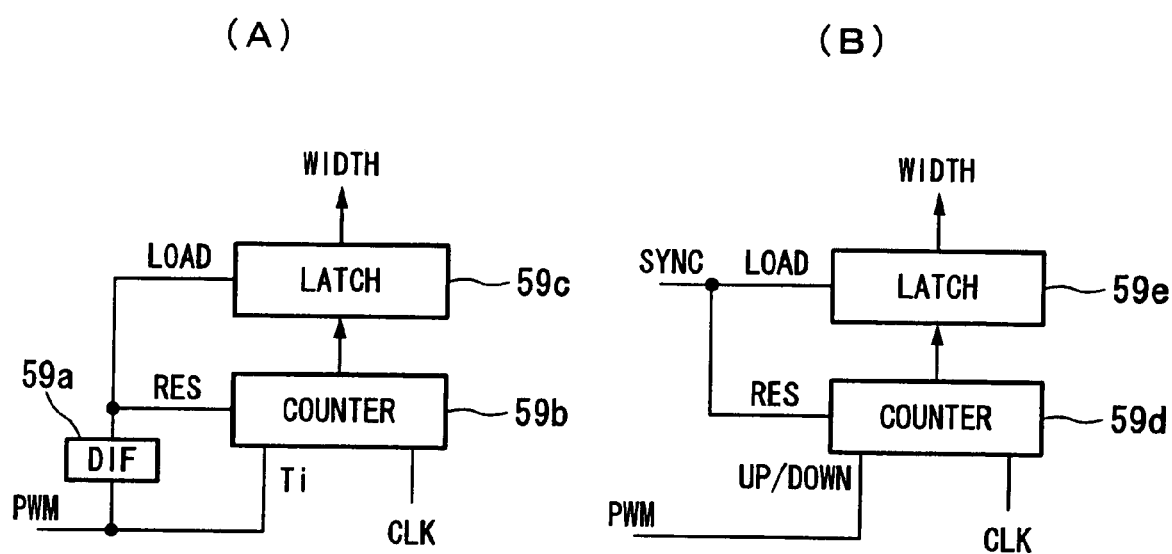
FIG. 16A is a block diagram for illustrating a counter using a pulse of the embodiment shown in FIG. 15.
FIG. 16B is a block diagram for illustrating a counter using a sync of the embodiment shown in FIG. 15.

FIG. 16A is a block diagram for illustrating a counter 59 using a pulse of the embodiment shown in FIG. 15. A DIFF 59a of FIG. 16A generates a pulse signal in response to a rising edge of the output from the level shifter 58. A counter 59b is reset in response to the rising edge of the pulse signal, and carries out upcount of the clock pulse when the output of the level shifter 58 is "H." On a rising edge of the next pulse, a counter value of the counter 59b is read into a latch 59c, which measures a PWM width.

FIG. 16B is a block diagram for illustrating a counter 59 using a sync of the embodiment shown in FIG. 15. The sync, which is a frame header signal of the PWM, is used to reset a counter 59d, which performs upcount of the clock pulse CLK when the output of the level shifter 58 is "H" and downcount of the clock pulse CLK when the output of the level shifter 58 is "L (low)." A counter value of the counter 59d is read into a latch 59e on the following sync.

Since the counter in the figure is synchronized with the sync of the PWM, the output data does not depend on a PWM waveform, but on the sync.

Reference numeral 60 of FIG. 15 represents a digital low pass filter that has the same characteristics as those of the LPF 56. Reference numeral 60 is a multiplier for multiplying the output from the LPF 60 by a coefficient k, whose output is added to the adder 53.

In the configuration, PCM sound data applied at the input terminal 51 is converted to a PWM signal by the PWM circuit 54, which is then voltage-amplified by the switching circuit 55 having the power transistors Trs 55a and 55b. The voltage-amplified signal passes the LPF 56 consisting of coils and capacitors to have a carrier component of the PWM eliminated. Then, the signal is supplied to a load 57 such as a speaker. This produces a large capacity of output.

Since a gap is provided so that delay in the power transistors Trs 55a and 55b may not vary or the power transistors Trs 55a and 55b may not be simultaneously turned on, a signal is produced that has a timing different from that of the PWM output, which causes distortion in the load output.

Accordingly, in the embodiment, the output of the power transistors Trs 55a and 55b is level shifted by a resistance division, which is counted by the clock pulse CLK to regenerate a PWM output value.

The value is derived by adding an error (e) created by a variation of the power transistors to a PWM input value. Because the signal passes the digital low pass filter 60 having the same characteristics as those of the LPF 56, a digital signal is obtained that is at the same level as the load output. The signal from the LPF 60 is multiplied by a feedback coefficient k to be added to the input signal at the adder 53. This is expressed by the following equation. $y=\{x(1-k)\}/\{1-kLPF(z)\}+e/\{1-kLPF(z)\}$ where a coefficient A of the multiplier 52 is (1−k) and the value k is negative. Since the gain of the low pass filter is 0 dB within a passband, the output y is equal to x within the passband and the error e is suppressed by (1−k). This means that quantization noise by PWM is also suppressed simultaneously.

Figure 17:
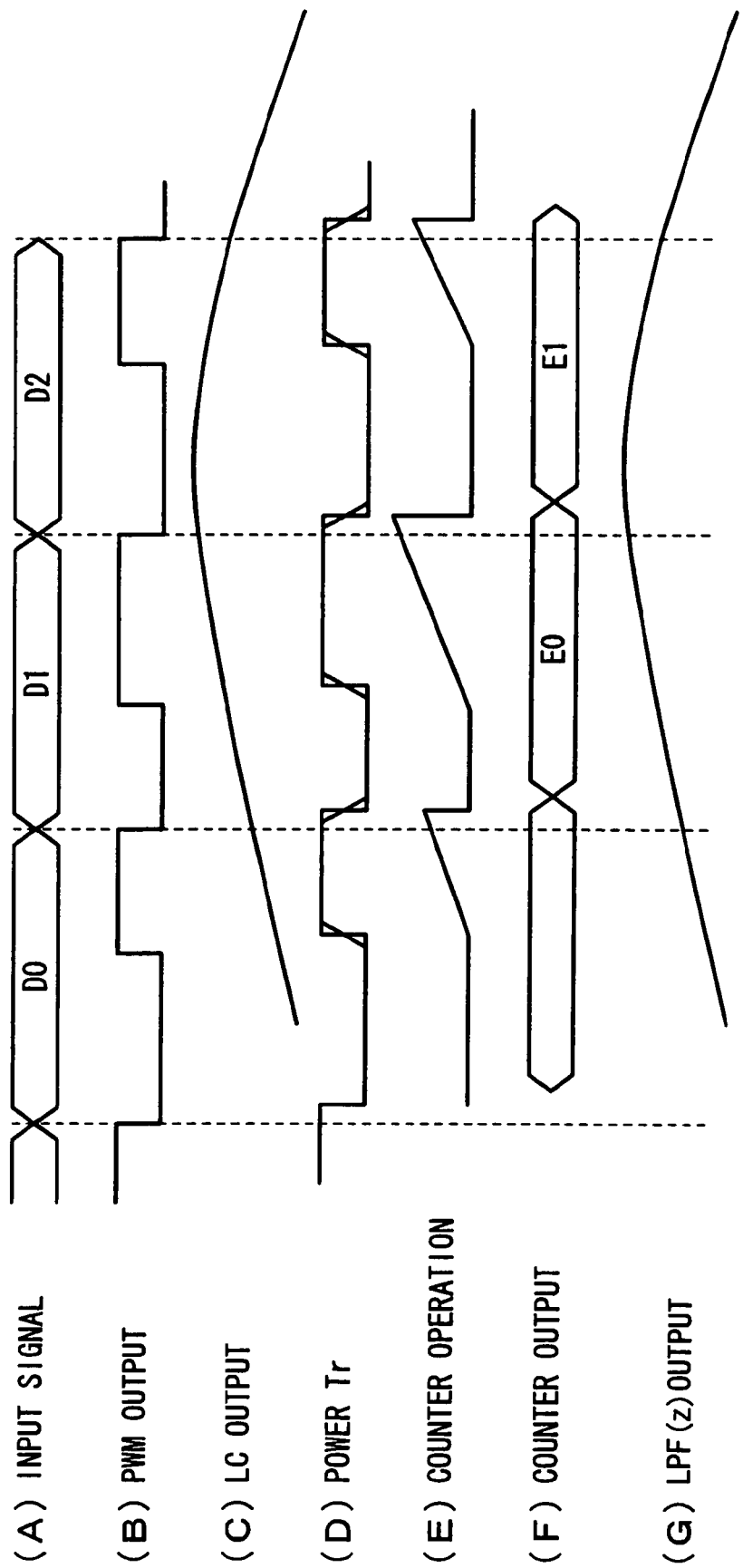
FIG. 17 is a set of waveforms for illustrating an operation of the embodiment shown in FIG. 15.

FIG. 17 is a set of waveforms for illustrating an operation of the embodiment shown in FIG. 15. As shown in (A) of FIG. 17, when sound data D0, D1, and D3 are successively input from the input terminal 51, they are converted to a PWM signal by the PWM circuit 54 ((B) of FIG. 17). The signal is then voltage-amplified by the power transistors Trs 55a and 55b ((D) of FIG. 17), and then has the carrier component thereof eliminated by the LPF 56 ((C) of FIG. 17).

The power transistors Trs 55a and 55b supply their output behind the PWM output and with an error caused by dead time, rising time, and falling time. The output is level-shifted to a logic voltage by the level shifter 58 to be applied to the counter 59. The counter 59 counts time from a rising edge to a falling edge, of the output from the power transistors Trs 55a and 55b to measure pulse width ((E) of FIG. 17) and produce an output ((F) of FIG. 17). An upcounter may be used for measuring pulse width. When the measured results are supplied to the low pass filter 60 after measuring the pulse width, a digital signal can be obtained that is the same as an output from the low pass filter 56 ((G) of FIG. 17). The digital signal is multiplied by the feedback gain k, and is provided to the input, which can eliminate distortion and noise.

Figure 18:
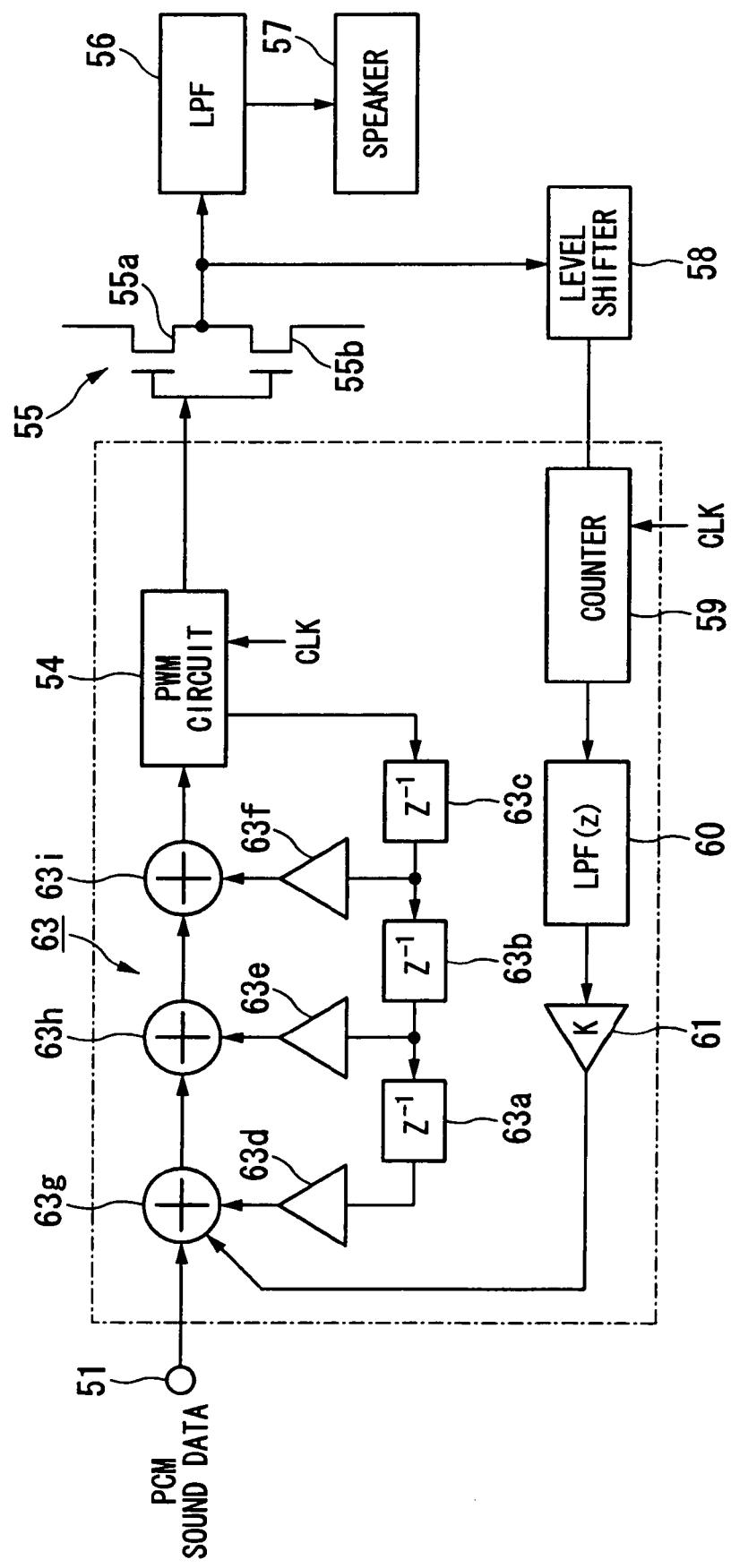
FIG. 18 is a block diagram for illustrating a structure of a class D amplifier in accordance with a seventh embodiment of the invention.

FIG. 18 is a block diagram for illustrating a structure of a class D amplifier in accordance with a seventh embodiment of the invention. Like reference numerals are assigned to the structural elements in FIG. 18 that are identical to those of the embodiment in FIG. 15, and no explanation of the elements is repetitiously given. The seventh embodiment of FIG. 18 is different from the embodiment of FIG. 15 in the following point. In FIG. 18, the multiplier 52 of FIG. 15 is deleted, and a compensation circuit 63 is added.

The compensation circuit 63 is a circuit for performing a .DELTA..SIGMA. compensation and compensating quantization noise of the PWM circuit 54. Moreover, the compensation circuit 63 feedbacks the quantization noise to the input through integration circuits. The quantization noise is added to the PCM sound data to be removed. As shown in the figure, the compensation circuit 63 is a third order IIR filter that consists of delay circuits 63a, 63b, and 63c serially connected for delaying by one clock, multipliers 63d, 63e, and 63f for multiplying an output from the delay circuits 63a, 63b, and 63c by a constant, respectively, and adders 63g, 63h, and 63i for successively adding an output from the multipliers 63d, 63e, and 63f to the PCM sound data, respectively.

Since there are many cases where the digital low pass filter 60 of the embodiment in FIG. 15 has two or more order, it is difficult to raise the loop gain k. Accordingly, sufficient suppression cannot be obtained. Therefore, quantization noise, which is a dominant error, should be suppressed by a noise shaper (a compensation circuit 63). This gives rise to an advantage that each noise measured at the counter 59 and the digital low pass filter 60 is related to the power transistors Trs 55$a$ and 55$b$ and small in amount to lead to a low loop gain.

Figure 19:
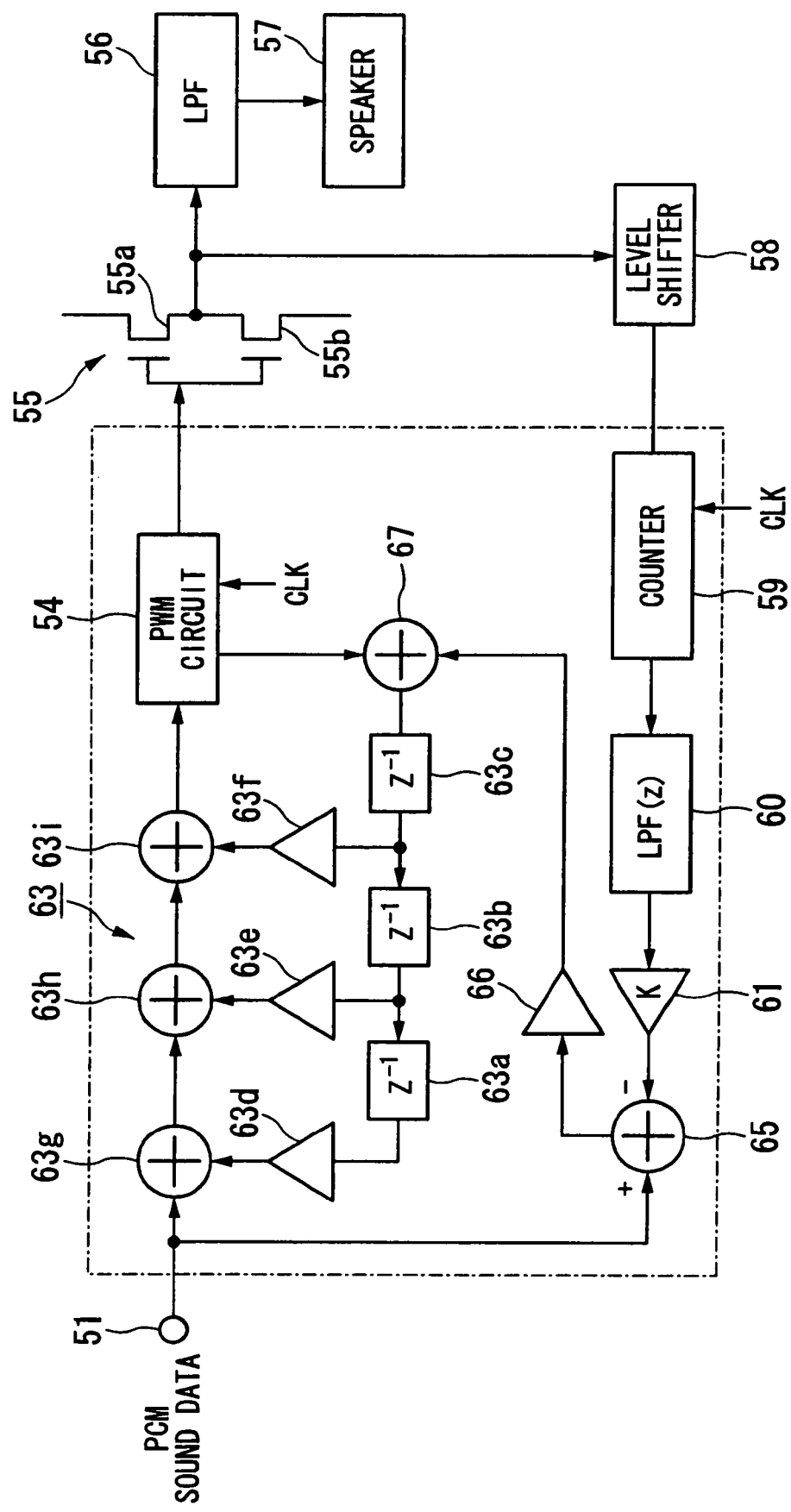
FIG. 19 is a block diagram for illustrating a structure of a class D amplifier in accordance with an eighth embodiment of the invention.

FIG. 19 is a block diagram for illustrating a structure of a class D amplifier in accordance with an eighth embodiment of the invention. Like reference numerals are assigned to the structural elements in FIG. 19 that are identical to those of the embodiment in FIG. 18, and no explanation of the elements is repetitiously given. The eighth embodiment of FIG. 19 is different from the embodiment of FIG. 18 in the following points. The eighth embodiment is newly provided with an arithmetic circuit 65 for obtaining an error between the output from the multiplier 61 and the sound data from the input terminal 51, a multiplier 66 for multiplying the output from the arithmetic circuit 65 by a constant coefficient, and an adder 67 for adding the quantization noise from the PWM circuit 54 and the output from the multiplier 66, whose addition result is supplied to the delay circuit 63$c$ in the compensation circuit 63.

The arithmetic circuit 65 obtains an error between the digital PCM sound data from the input terminal 51 and the signal regenerated by the digital low pass filter 60. The error signal is applied to the noise shaper (the compensation circuit 63) to be suppressed. In the case, the design of third or more order filters can be made easier to increase a suppression gain, by which a system having few distortion noise can be constructed.

With regard to the embodiment of FIG. 19, the design of the low pass filter 60 is difficult to make, the output is produced by a PWM cycle delay because of the measurement at the counter, and delay exists on account of a large amount of process. This gives rise to a problem that it is difficult to construct an effective noise shaper.

Figure 20:
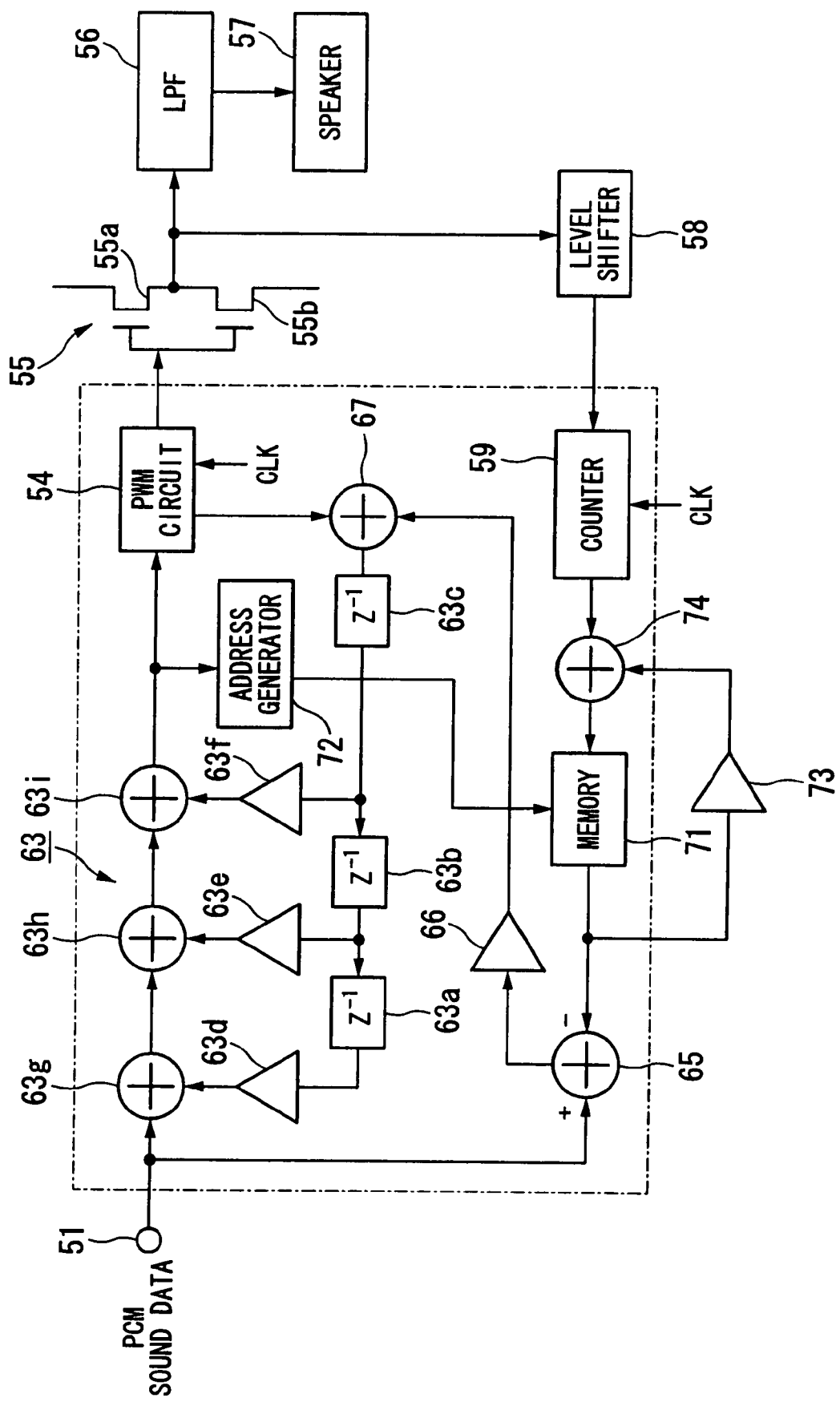
FIG. 20 is a block diagram for illustrating a structure of a class D amplifier in accordance with a ninth embodiment of the invention.

FIG. 20 is a block diagram for illustrating a structure of a class D amplifier in accordance with a ninth embodiment of the invention that has solved the problem. Like reference numerals are assigned to the structural elements in FIG. 20 that are identical to those of the embodiment in FIG. 19, and no explanation of the elements is repetitiously given. The ninth embodiment of FIG. 20 is different from the eighth embodiment of FIG. 19 in the following points. The ninth embodiment is newly provided with an memory 71 in place of the low pass filter 60 and the multiplier 61 of the eighth embodiment of FIG. 19, an address generator 72 for generating addresses of the memory 71 based on the data input to the PWM circuit 54, a multiplier 73 for multiplying output data of the memory 71 by a constant coefficient, and an adder 74 for adding the output from the multiplier 73 and the output from the counter 59, whose added results are applied to the input terminal of the memory 71.

According to the embodiment, a value derived by counting a pulse width (an output from the counter circuit 59) is stored in a memory address that corresponds to the input data to the PWM circuit 54, and is used as a compensation table. The arithmetic circuit 65 compares the output data from the memory 71 with the PCM sound data from the input terminal 51, whose comparison results are fed to the noise shaper (the compensation circuit 63). Since this constitutes a loop in disregard of a PWM cycle delay caused by the counter circuit 59, effective noise elimination can be realized. However, because the output from the counter 59 is a pulse in power stage, it is liable to receive noise and is not stable. When reading the data into the memory 71, an average value of the data and the previous data should be taken, or as shown in FIG. 20, a low pass filter should be constructed for the previous data, by which noise can be eliminated. The multiplier is provided for that purpose.

Moreover, in a case where an output is taken from the memory 71, taking an average of the output values is more effective, by using an address before and behind a desired address.

Figure 21:
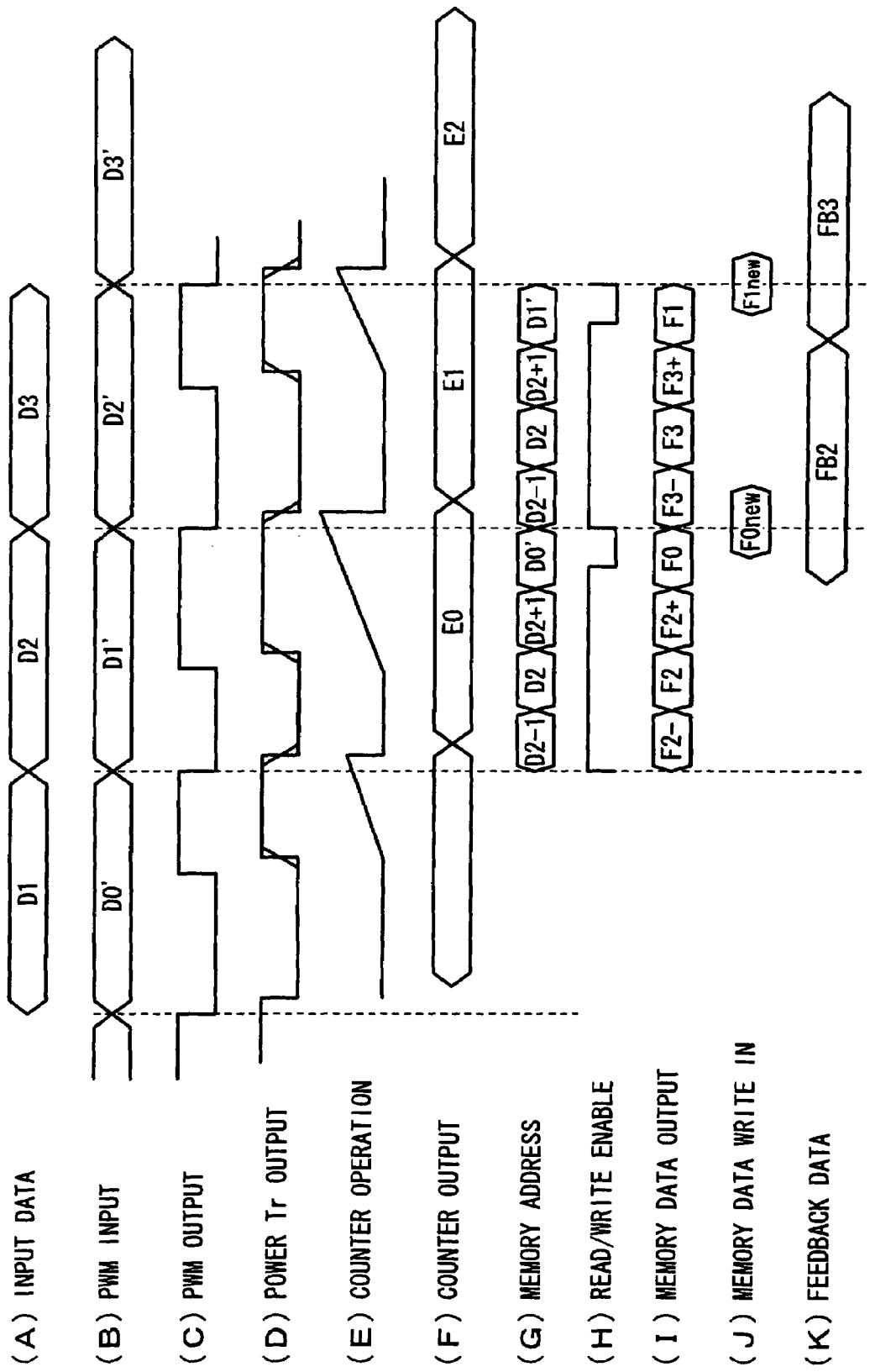
FIG. 21 is a set of waveforms for illustrating an operation of the embodiment shown in FIG. 20.

FIG. 21 is a set of waveforms for illustrating an operation of the embodiment shown in FIG. 20. The waveforms also show the timing of the operation. In the figure, the operation by the counter 59 including the measurement ((A) to (E) of FIG. 21) is the same as that explained regarding FIG. 17 ((A) to (E) of FIG. 17). The output of the counter 59 is written into the memory 71 based on the output from the address generator 72, i.e., based on the address data corresponding to the input data for the PWM circuit 54. At this time, because the previous and following memory address needs to be read to obtain a low pass filter and feedback data, using the present data and previous data of the memory 71, the corresponding data is read in making the address −1, +1, +0 in the first half of a period. In the situation, a PWM signal of data D0 is output and E0 is obtained ((F) of FIG. 21) at the counter 59.

Addresses D2−1 to D2+1 are generated ((G) of FIG. 21), using the data (PCM musical data) from the input terminal 51, in order to eliminate noise around the memory 71 in the first half of the PWM period. Since the corresponding data F2−/F2/F2+ is output ((I) of FIG. 21), noise can be eliminated taking an average of the data. The data is added to input data D2 as data FB2 ((K) of FIG. 21) and is input to the PWM circuit 54 as data D2' ((B) of FIG. 21). When a pulse width is measured by the counter 59 behind a PWM cycle and E0 is obtained ((F) of FIG. 21), read in is executed first and the previous data E0 is read out, in accordance with an address D0'. The previous data E0 and the presently read out data E0 are arithmetically operated, and the result of the operation is written in the memory 71 as data F0 new ((J) of FIG. 21).

Figure 22:
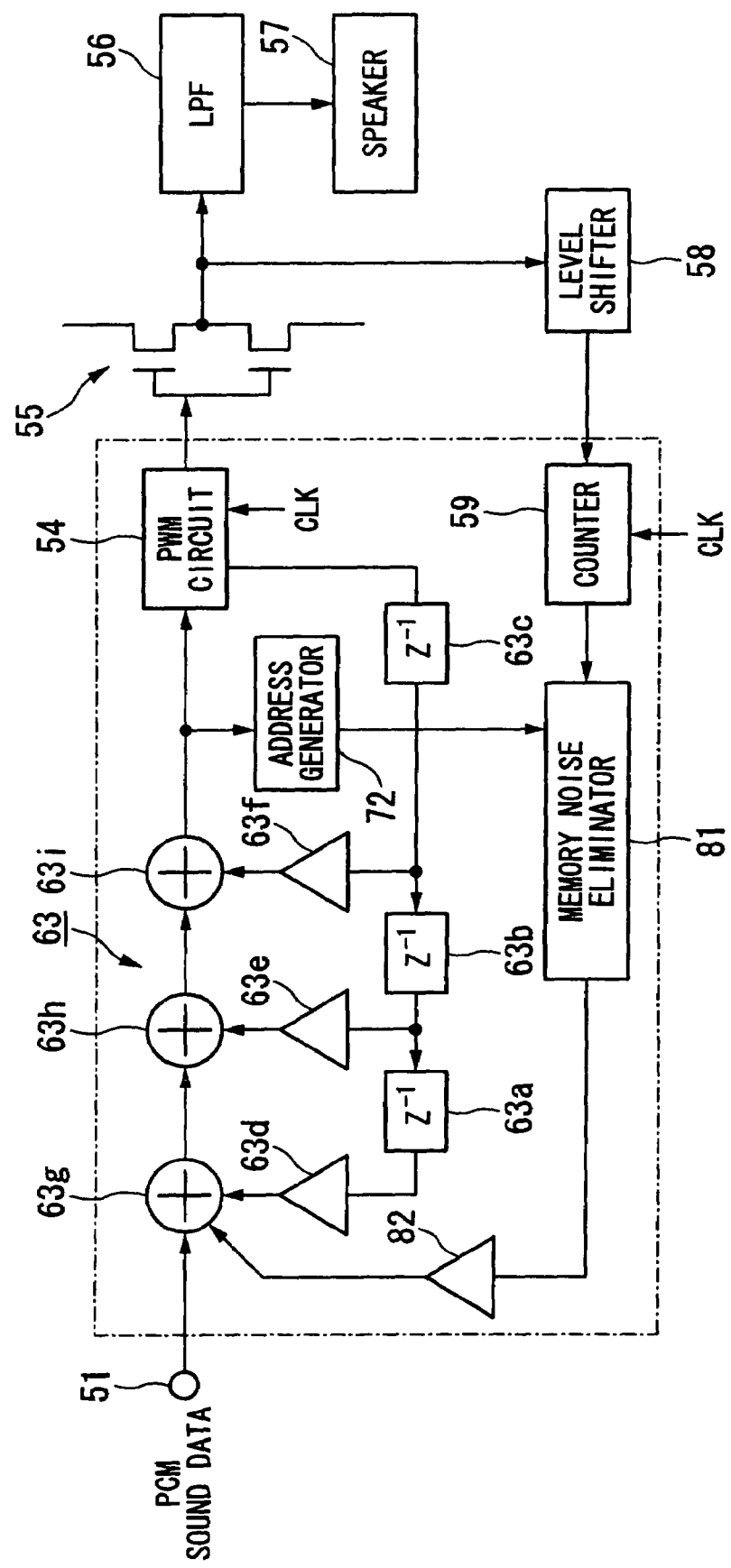
FIG. 22 is a block diagram for illustrating a structure of a class D amplifier in accordance with a tenth embodiment of the invention.

FIG. 22 is a block diagram for illustrating a structure of a class D amplifier in accordance with a tenth embodiment of the invention. In the figure, reference numeral 81 designates a memory and noise eliminator that is identical to the memory 71, the multiplier 73, and the adder 74. The output of the memory and noise eliminator 81 is applied to the multiplier 82 that adjusts a gain. The output of the multiplier 82 is added to the adder 63$g$ of the compensation circuit 63. The adder 65, the multiplier 66, and adder 67 in FIG. 20 are not provided. Other configuration of FIG. 22 is the same as that of FIG. 20. In the embodiment, a memory output is fedback to an input to remove noise, which is the same function as that of the embodiment of FIG. 20.

The memory and noise eliminator 81 in the embodiment may be constructed by an average circuit, not a low pass filter as in FIG. 20.

According to the ninth and tenth embodiments, a signal derived by dividing the power output using a resistance division through the level shifter 58 can be averaged with respect to time, averaged based on a previous and subsequent level such as a voltage level, or processed using a low pass filter. This eliminates influence caused by surrounding noise or quantization, which enables precise feedback.

In the ninth and tenth embodiments, an error signal between the output from the counter 59, which is not furnished to the memory, and the digital signal from the input terminal 51 may be calculated and stored. In the case, the output from the memory can be directly applied to the noise shaper (compensation circuit).

In the sixth to eighth embodiments, phase compensation may be added to the low pass filter 60 when the need arises.

The DC component of the counter 59 is detected through the low pass filter whose cutoff frequency is set at a low value to shut down the output from the PWM circuit 54 or the output from the switching circuit 55, so that the load 57 may be protected. The counter 59 and the low pass filter 60 are provided, but the output from the level shifter may be directly applied to the low pass filter 60.

Figure 23:
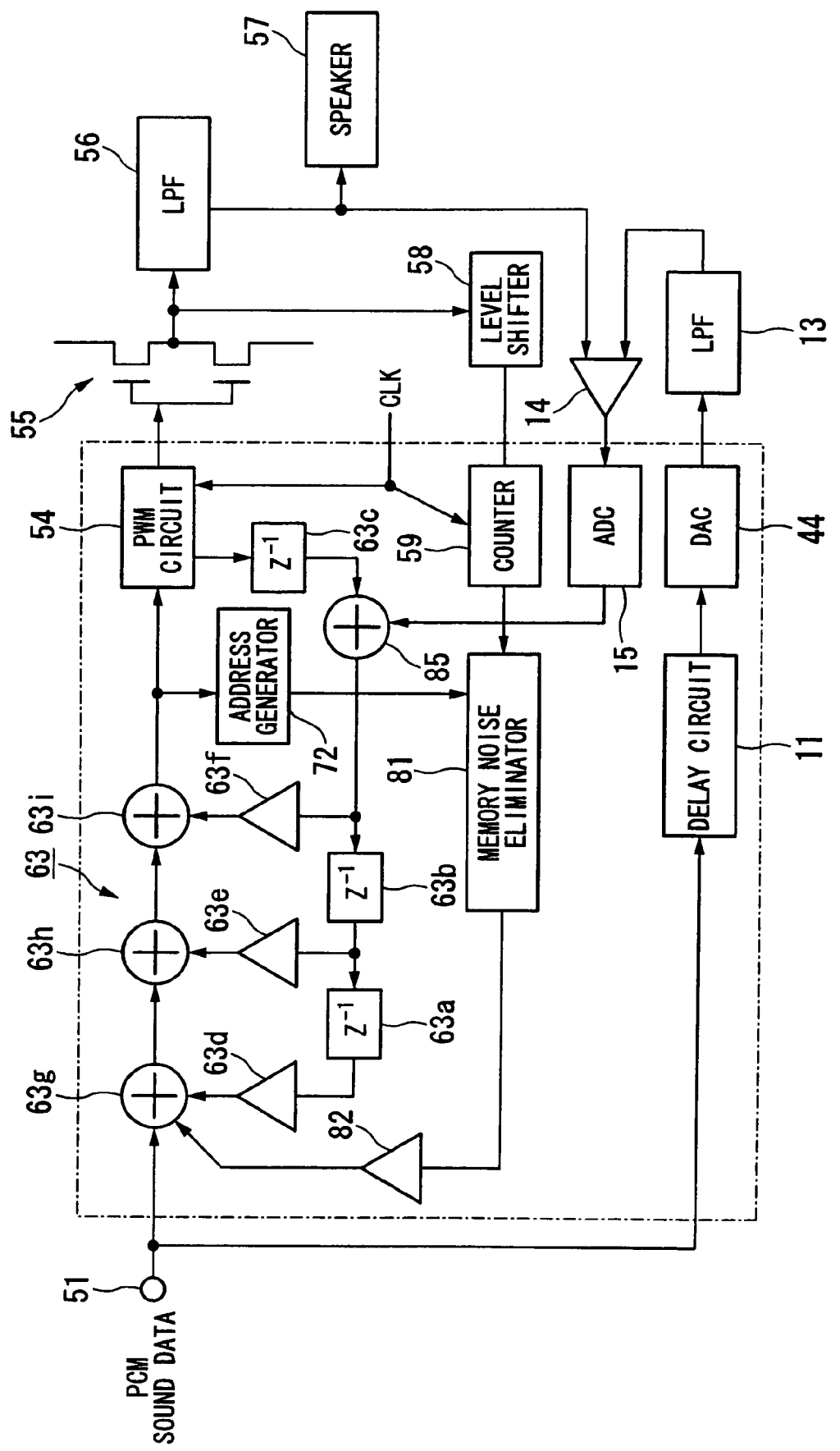
FIG. 23 is a block diagram for illustrating a structure of a class D amplifier in accordance with an eleventh embodiment of the invention.

FIG. 23 is a block diagram for illustrating a structure of a class D amplifier in accordance with an eleventh embodiment of the invention. The eleventh embodiment is derived by adding the noise elimination configuration (reference numerals 11-15) shown in the fourth embodiment FIG. 10 to the tenth embodiment of FIG. 22. In the eleventh embodiment, an adder 85 is incorporated between delay circuits 63b and 63c so as to attach the ADC 15 to the compensation circuit 63.

It is a matter of course that the present invention can be applied to not only sound data but also other kinds of data such as musical data.

The invention is mainly used for a digital AV amplifier.

The invention provides a class D amplifier that enables a simple structure and effectively reduces distortion and noise over previous generations. In addition, with regard to a difference conversion, analog to digital conversion can be used to convert an analog signal to a PWM signal.

Since the invention handles as digital a signal derived by level-shifting power output through a resistance division, the circuit can be constructed at low cost. Moreover, the invention uses a digital signal processor (DSP) without using an analog filter, quantization noise and environmental noise can be eliminated, and a signal that is equivalent to one derived by AD conversion is obtained to acquire highly precise feedback.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A class D amplifier comprising:
    a first PWM circuit for receiving input data and converting the input data to a first PWM signal;
    a power amplifier for amplifying the first PWM signal;
    a low pass filter for passing low frequency components of the amplified first PWM signal to a load;
    a second PWM circuit for converting the input data to a second PWM signal;
    a first filter for only passing wanted frequency components of the second PWM signal;
    a second filter for only passing wanted frequency components of the amplified first PWM signal from the power amplifier;
    a difference detector for detecting a difference between a first filter output signal output from the first filter and a second filter output signal output from the second filter;
    a conversion unit for converting the detected signal difference to digital data; and
    a feedback unit for feeding back the converted digital data to an input of the first PWM circuit.

2. A class D amplifier as recited in claim 1, wherein the conversion unit includes:
    a dither generator for generating a dither signal;
    an adder for adding the dither signal to an output of the difference detector;
    a pulse width conversion unit for converting an output of the adder to a pulse width; and
    a counter for converting the pulse width to digital data.

3. The class D amplifier as recited in claim 1, wherein the feedback unit comprises an adder for adding the quantization noise of the first PWM circuit and an output of the conversion unit.

4. The class D amplifier as recited in claim 3, wherein the conversion unit comprises:
    a counter for counting a clock pulse from the first PWM circuit; and
    a multiplier for multiplying an output from the counter by −1.

* * * * *